United States Patent
Gu

(10) Patent No.: US 12,217,820 B2
(45) Date of Patent: Feb. 4, 2025

(54) COUNTER CIRCUIT

(71) Applicant: CHANGXIN MEMORY TECHNOLOGIES, INC., Hefei (CN)

(72) Inventor: Yinchuan Gu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 192 days.

(21) Appl. No.: 18/155,900

(22) Filed: Jan. 18, 2023

(65) Prior Publication Data

US 2023/0377615 A1 Nov. 23, 2023

Related U.S. Application Data

(63) Continuation of application No. PCT/CN2022/096073, filed on May 30, 2022.

(30) Foreign Application Priority Data

May 23, 2022 (CN) .......................... 202210562822.3

(51) Int. Cl.
*G11C 7/10* (2006.01)
*G11C 7/22* (2006.01)
*H03K 19/20* (2006.01)

(52) U.S. Cl.
CPC ............ *G11C 7/1063* (2013.01); *G11C 7/106* (2013.01); *G11C 7/222* (2013.01); *H03K 19/20* (2013.01)

(58) Field of Classification Search
CPC ....... G11C 7/1063; G11C 7/106; G11C 7/222; G11C 11/40611; G11C 11/4076;
(Continued)

(56) References Cited

U.S. PATENT DOCUMENTS 6,704,762 B1 * 3/2004 Inoue .................... G06F 7/5443
708/628
7,739,324 B1 * 6/2010 Das ....................... G06F 7/5443
708/603
(Continued)

FOREIGN PATENT DOCUMENTS

CN 101060326 A 10/2007
CN 105468335 A 4/2016
(Continued)

OTHER PUBLICATIONS

JEDEC Solid State Technology Association, "JEDEC Standard DDR5 SDRAM JESD79-5" Jul. 2020, 496 pages.

*Primary Examiner* — Tha-Oh Bui
(74) *Attorney, Agent, or Firm* — Syncoda LLC; Feng Ma

(57) ABSTRACT

A counter circuit includes an addition circuit including counting circuits corresponding to binary bits, a subtraction circuit and control circuits. Each counting circuit obtains a carry signal and this-time bit value according to addend signal and bit value currently output by the counting circuit, outputs the carry signal to next counting circuit, and latches the this-time bit value in response to first clock and outputs same to output terminal of the counting circuit in response to second clock. The subtraction circuit is connected to the counting circuits, obtains present subtraction counting result according to present addition counting result and subtrahend signal and outputs same in response to a first refresh instruction. Each control circuit corresponds to a counting circuit, outputs, in response to second refresh instruction, corresponding bit of the present subtraction counting result to the counting circuit to serve as the bit value output by the counting circuit.

20 Claims, 13 Drawing Sheets

(58) Field of Classification Search
CPC ........ G11C 11/408; G11C 8/04; H03K 19/20; H03K 21/38
USPC .................................................... 365/189.05
See application file for complete search history.

(56) References Cited

U.S. PATENT DOCUMENTS

| | | |
|---|---|---|
| 10,103,742 B1 | 10/2018 | Guo |
| 10,997,892 B1 | 5/2021 | Lan et al. |
| 11,290,117 B1 * | 3/2022 | Kosednar, Jr. ............ H03L 7/08 |
| 11,373,711 B2 * | 6/2022 | Lee .......................... G11C 8/04 |
| 2002/0126560 A1 | 9/2002 | Cowles |
| 2020/0134268 A1 | 4/2020 | Frantz |

FOREIGN PATENT DOCUMENTS

| | | |
|---|---|---|
| CN | 106330169 A | 1/2017 |
| CN | 110199482 A | 9/2019 |
| CN | 112820225 A | 5/2021 |
| CN | 113114190 A | 7/2021 |
| SU | 879494 A1 | 11/1981 |
| WO | 2016019788 A1 | 2/2016 |

* cited by examiner

COUNTER CIRCUIT

CROSS-REFERENCE TO RELATED APPLICATIONS

This application is a continuation of International Application No. PCT/CN2022/096073, filed on May 30, 2022, which is based upon and claims priority to Chinese patent application No. 202210562822.3, filed on May 23, 2022, and entitled "Counter Circuit". The disclosures of International Application No. PCT/CN2022/096073 and Chinese patent application No. 202210562822.3 are incorporated herein by reference in their entireties.

BACKGROUND

With the development of memory technologies, memories are widely used in various fields, for example, a Dynamic Random Access Memory (DRAM) is widely used.

In practical applications, the memory usually needs to have a counting function to support the operation of the memory. For example, the counting function can be used not only for counting clock pulses, but also for frequency division, timing, generation of beat pulses and pulse sequences, and performing digital operations. Therefore, a counter circuit needs to be provided to realize the counting function.

SUMMARY

The present disclosure relates to memory technologies, a counter circuit.

According to some embodiments, a first aspect of the present disclosure provides a counter circuit, including an addition circuit, a subtraction circuit and a plurality of control circuits. The addition circuit includes multiple stages of counting circuits corresponding to binary bits, and each stage of counting circuit is configured to: obtain a carry signal and a this-time bit value according to an addend signal and a bit value that is currently output by the stage of counting circuit, output the carry signal to a next-stage counting circuit, latch the this-time bit value in response to a first clock, and output the this-time bit value to an output terminal of the stage of counting circuit in response to a second clock, wherein an addend signal of a start-stage counting circuit is a high-level signal, and an addend signal of a non-start-stage counting circuit is a carry signal output by an immediately previous stage of counting circuit. The subtraction circuit is connected to the multiple stages of counting circuits and is configured to: obtain a present subtraction counting result by calculating according to a present addition counting result and a subtrahend signal, and output the present subtraction counting result in response to a first refresh instruction, wherein the present addition counting result is a multi-bit signal composed of this-time bit values output by the multiple stages of counting circuits, and the present subtraction counting result includes a multi-bit signal. Each of the plurality of control circuits corresponds to a respective one of the multiple stages of counting circuits, is connected to the respective one of the multiple stages of counting circuits and the subtraction circuit, and is configured to output, in response to a second refresh instruction, a corresponding bit of the present subtraction counting result to the respective one of the multiple stages of counting circuits to serve as the bit value output by the respective one of the multiple stages of counting circuits, wherein an output of the counter circuit is composed by bit values output by the multiple stages of counting circuits, the output is a binary representation of a counting result, the first clock and the second clock are obtained based on division of a system clock, and the first refresh instruction and the second refresh instruction are obtained based on division of a refresh instruction.

BRIEF DESCRIPTION OF THE DRAWINGS

The accompanying drawings, which are incorporated in and constitute a part of the description, illustrate embodiments consistent with the present application and together with the description serve to explain the principles of the embodiments of the present disclosure.

Figure 1:
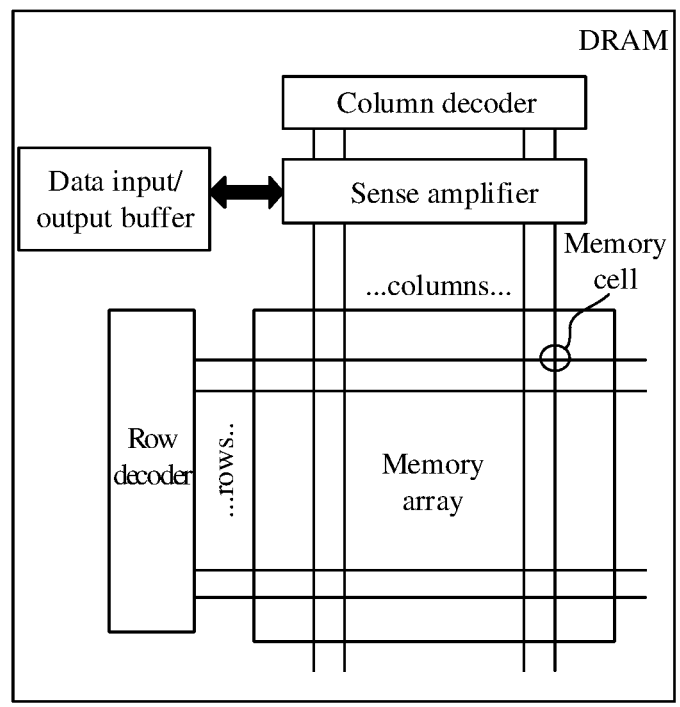
FIG. 1 illustrates a schematic diagram of architecture of a memory according to an embodiment of the present disclosure.

Specific embodiments of the present disclosure have been shown by the above drawings, and will be described in more detail later. These drawings and descriptions are not intended to limit the scope of the concept of the present disclosure, but to illustrate the concepts of the present disclosure for those skilled in the art by reference to specific embodiments.

DETAILED DESCRIPTION

Exemplary embodiments will be described in detail herein, examples of which are illustrated in the accompanying drawings. When the following description relates to the drawings, the same numerals in different drawings represent the same or similar elements unless otherwise indicated. The implementations described in the exemplary embodiments below are not intended to represent all implementations consistent with the present disclosure. Rather, they are merely examples of apparatuses and methods consistent with some aspects of the present disclosure as detailed in the appended claims.

The terms "comprise", "include" and "have" in the present disclosure are intended to be inclusive in an open manner and to mean that additional elements/components or like may be present in addition to the listed elements/components or like. The terms such as "first" and "second" are used only as labels or distinctions, and are not intended to limit the order or number of objects. Furthermore, various elements and areas in the drawings are shown only schematically and therefore the present disclosure is not limited to the dimensions or distances shown in the drawings.

The technical solution of the present disclosure will be described in detail with specific embodiments below. The following specific embodiments may be combined with one another, and the same or similar concepts or processes may not be repeated in some embodiments. Embodiments of the present disclosure will be described below in conjunction with the accompanying drawings.

FIG. 1 illustrates a schematic diagram of architecture of a memory according to an embodiment of the present disclosure. As illustrated in FIG. 1, taking a DRAM as an example, a data input/output buffer, a row decoder, a column decoder, a sense amplifier, and a memory array are included. The memory array is mainly composed of word lines, bit lines and memory cells. The word lines in the memory array extend in the row direction, the bit lines in the memory array extend in the column direction, and memory cells of the memory array are provided at the intersections of the word lines and the bit lines.

Figure 2:
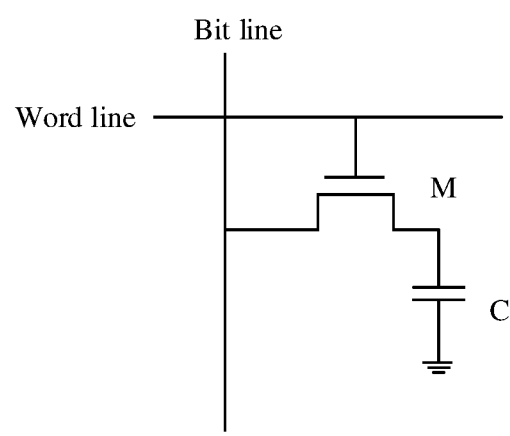
FIG. 2 illustrates a schematic structural diagram of a memory cell according to an embodiment of the present disclosure.

Each memory cell is used to store one bit of data. As illustrated in FIG. 2, FIG. 2 illustrates a schematic structural diagram of a memory cell according to an embodiment of the present disclosure. The memory cell is mainly composed of a transistor M and a capacitor C. The capacitor is used to store data, and the transistor is turned off or on according to the state of the word line.

A certain memory cell can be activated by controlling a row and a column, to achieve the access to the memory cell. Taking a reading scenario as an example, when the data in the memory cell needs to be read, the word line of the row where the memory cell is located can be selected by the row decoder; accordingly, the transistor M in the drawing is turned on, and the state on the capacitor C at this time can be perceived by sensing and amplifying the bit line signal. For example, if the data stored in the memory cell is 1, the transistor M will read 1 from the bit line of the memory cell after being turned on, and vice versa. In addition, taking a writing scenario as an example: when the data needs to be written to a certain memory cell, such as writing 1 to the memory cell, the word line of the row where the memory cell is located can be selected by the row decoder; accordingly, the transistor M in the drawing is turned on, and the capacitor C is charged by setting a logic level of the bit line to be 1, that is, 1 is written to the memory cell. On the contrary, if 0 is to be written, the logic level of the bit line is 0, so that the capacitor C is discharged, that is, 0 is written to the memory cell.

In practical applications, in order to support the operation of the memory, a counting function needs to be used. For example, as specified in the double data rate 5 (DDR5) Joint Electron Device Engineering Council (JEDEC) standard, in order to improve the ability of DDR5 DRAM to withstand Row Hammer, a Rolling Accumulated ACT (RAA) counter for Refresh Management (RFM) is provided to detect and calculate the number of activation commands (ACT CMD) received by a memory in real time. Additionally, the standard specifies that the counter needs to update the counting result in response to a Refresh Management Instruction (RFM CMD, also referred to as the Refresh Instruction hereinafter) in particular by reducing a value of a Rolling Accumulated ACT Initial Management Threshold (RAAIMT). The RAAIMT depends on the operating mode of the memory (such as, a regular mode or a Fine Granularity Refresh (FGR) mode) and a configuration of a Mode Register (MRS), such as, a Mode Register Parameter Value (MRS Value).

Some aspects of embodiments of the present disclosure relate to the above considerations. An exemplary description of the scheme is given below in connection with some embodiments of the present disclosure.

Embodiment 1

Figure 3:
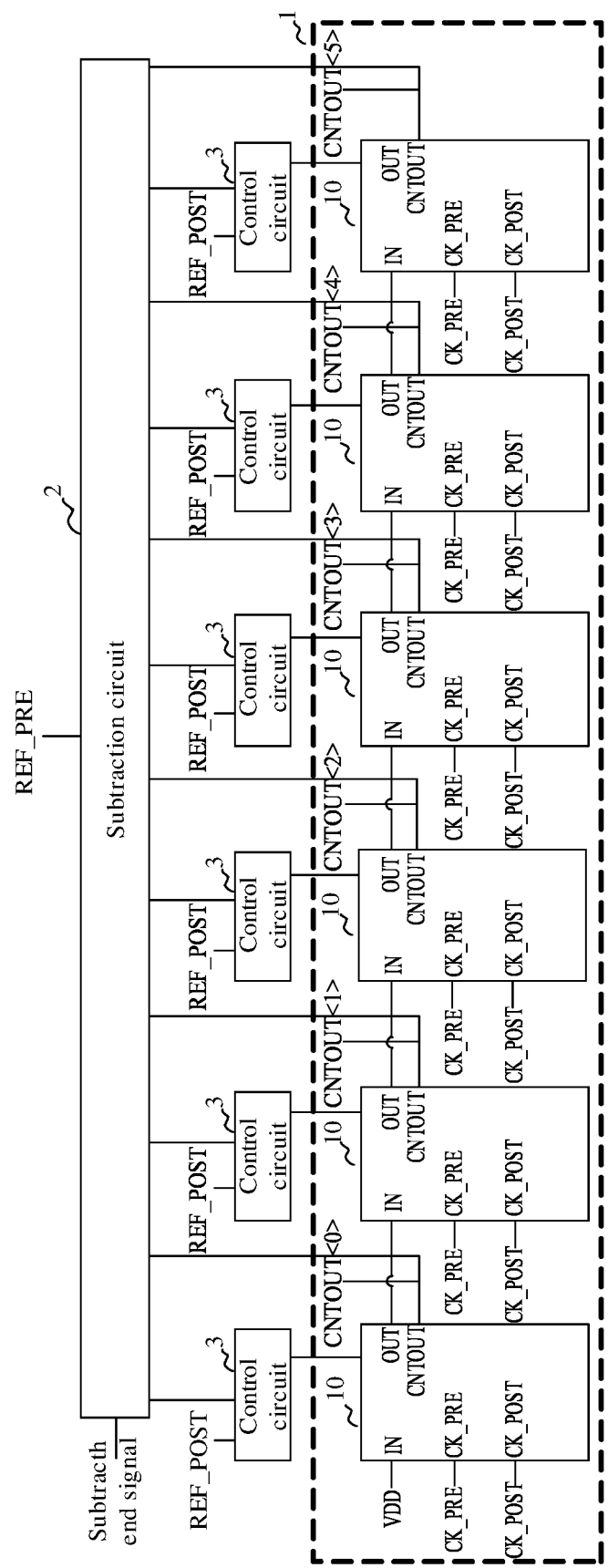
FIG. 3 illustrates a schematic structural diagram of a counter circuit according to an embodiment of the present disclosure.

FIG. 3 illustrates a schematic structural diagram of a counter circuit according to an embodiment of the present disclosure. As illustrated in FIG. 3, the counter circuit includes an addition circuit 1, a subtraction circuit 2 and a plurality of control circuits 3.

The addition circuit 1 includes multiple stages of counting circuits 10 corresponding to binary bits. Each stage of counting circuit 10 is configured to: obtain a carry signal and a this-time bit value according to an addend signal and a bit value currently output by the stage of counting circuit; output the carry signal to a next-stage counting circuit 10, latch the this-time bit value in response to a first clock CK_PRE, and output the this-time bit value to an output terminal of the counting circuit in response to a second clock CK_POST. An addend signal of a start-stage counting circuit 10 is a high-level signal, and an addend signal of a non-start-stage counting circuit 10 is a carry signal output by an immediately previous stage of counting circuit 10.

The subtraction circuit 2 is connected to the multiple stages of counting circuits 10 and is configured to: obtain a present subtraction counting result by calculating according to a present addition counting result and a subtrahend signal, and output the present subtraction counting result in response to a first refresh instruction REF_PRE. The present addition counting result is a multi-bit signal composed of this-time bit value outputs by the multiple stages of counting circuits 10, and the present subtraction counting result includes a multi-bit signal.

Each of the plurality of control circuits 3 corresponds to a respective one of the multiple stages of counting circuits 10, is connected to the respective one of the multiple stages of counting circuits 10 and the subtraction circuit 2, and is configured to output, in response to a second refresh instruction REF_POST, a corresponding bit of the present subtraction counting result to the respective one of the multiple stages of counting circuits 10 to serve as a current bit value output by the respective one of the multiple stages of counting circuits 10. An output of the counter circuit is composed by bit values output by the multiple stages of counting circuits 10, and the output is a binary representation of a counting result. The first clock CK_PRE and the second clock CK_POST are obtained based on division of a system clock (CLOCK), and the first refresh instruction REF_PRE and the second refresh instruction REF_POST are obtained based on division of a refresh instruction REF.

In practical applications, the counter circuit provided by the embodiment can be applied to various memories, including but not limited to a Double Data Rate DRAM (a DDR for short) and the like as an example.

In conjunction with FIG. 3, for example, the addition circuit is used to perform the addition counting, the subtraction circuit is used to perform the subtraction counting, and the control circuits are used to output the addition counting result or the subtraction counting result according to the states of the clock instruction and the refresh management instruction. That is, the counter circuit in the embodiment can realize the addition counting function while realizing the subtraction counting function. The system clock refers to the clock used for the counter circuit.

It should be noted that, in FIG. 3, the counting result being a six-bit binary number is taken as an example. It can be understood that, in practical applications, the number of corresponding circuits and parameters can be set according to the digit number of the counting result. For example, the number or the number of stages of counting circuits in the addition circuit can be determined according to counting scenarios and requirements. For example, the counting result may be an eight-bit counting result, and accordingly, the addition circuits may include eight stages of counting circuits. For another example, the number of output ports of the subtraction circuit can also be determined according to counting scenarios and requirements. For example, the subtraction circuit may include eight output ports, and accordingly, the subtraction counting result may be an eight-bit subtraction counting result. The number or the number of stages of counting circuits is not limited in the drawing.

Combined with the example of the drawing, CNTOUT<5:0> represents the binary representation of the counting result output by the counter circuit, i.e. the CNTOUT<...> output by each of the counting circuits is one bit of the binary representation of the counting result. For instance, a result CNTOUT<0> outputted by a start-stage counting circuit 10 is a lowest bit of the binary representation of the counting result, a result CNTOUT<1> outputted by a second-stage counting circuit 10 is the penultimate bit of the binary representation of the counting result, and so on, and a result CNTOUT<5> outputted by a last-stage counting circuit 10 is a highest bit of the binary representation of the counting result. For example, assuming that a combined output result of CNTOUT<5:0> is 001010, a decimal representation of the counting result of the counter circuit is 10.

Figure 4:
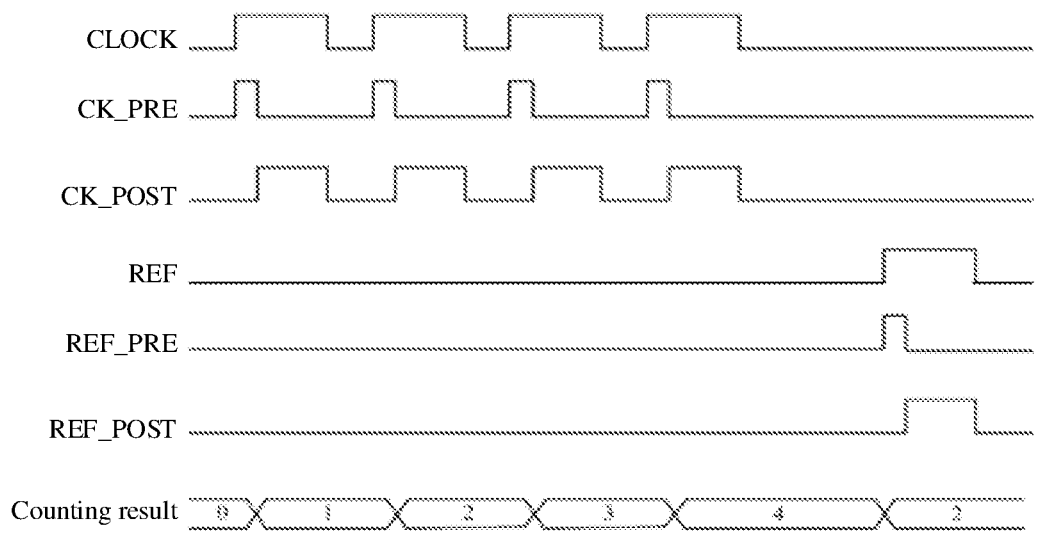
FIG. 4 is an exemplary signal timing diagram.

For better understanding of the scheme of the present embodiment, FIG. 4 illustrates a schematic signal timing diagram. In the drawing, CLOCK is an example of a timing waveform of a system clock, CK_PRE is an example of a timing waveform of a first clock, and CK_POST is an example of a timing waveform of a second clock. REF_PRE is an example of a timing waveform of a first refresh instruction, and REF_POST is an example of a timing waveform of a second refresh instruction. CNTOUT<5:0> is an example of timing of a counting result. Combined with the illustration of FIG. 4, the working process of the counter circuit is introduced with examples as the following.

The bit value of each stage of counting circuit refers to a low-bit data of the result output by the counting circuit. The carry signal of each stage of counting circuit refers to a high-bit data of the result output by the counting circuit, and the high bit data is transmitted to a next-stage counting circuit so that the next-stage counting circuit can obtain the carry signal and a carry value of the next-stage counting circuit by calculation according to the received carry signal and an addend signal. It can be understood that since the counting can be carried out in real time, the input and output of each stage of counting circuit are dynamically updated at different moments. Therefore, in the embodiment, the bit value output by the counting circuit at a current moment or in a current counting is also called as a this-time bit value, and the term "this-time" in other places also has similar meanings. In the embodiment, the addend signal depends on the stage of the counting circuit. As an example, for the start-stage counting circuit, the addend signal is a high-level signal and has the logic level state of 1, thus realizing the counting mode of accumulatively adding 1. In practical applications, the addend signal of the start-stage counting circuit can be provided by VDD, as shown in FIG. 4, the addend signal VDD is input into the counter circuit. As an example, the addend signal VDD in the drawing is input into the IN port of the start-stage counting circuit of the counter circuit. The addend signal of the non-start-stage counting circuit is the carry signal output by the immediately previous stage of counting circuit, and the IN port of each of the remaining counting circuits is connected to a carry output terminal OUT of the immediately previous stage of counting circuit thereof correspondingly. The carry output terminal OUT is configured to output a this-time carry signal of the present counting circuit.

Figure 5:
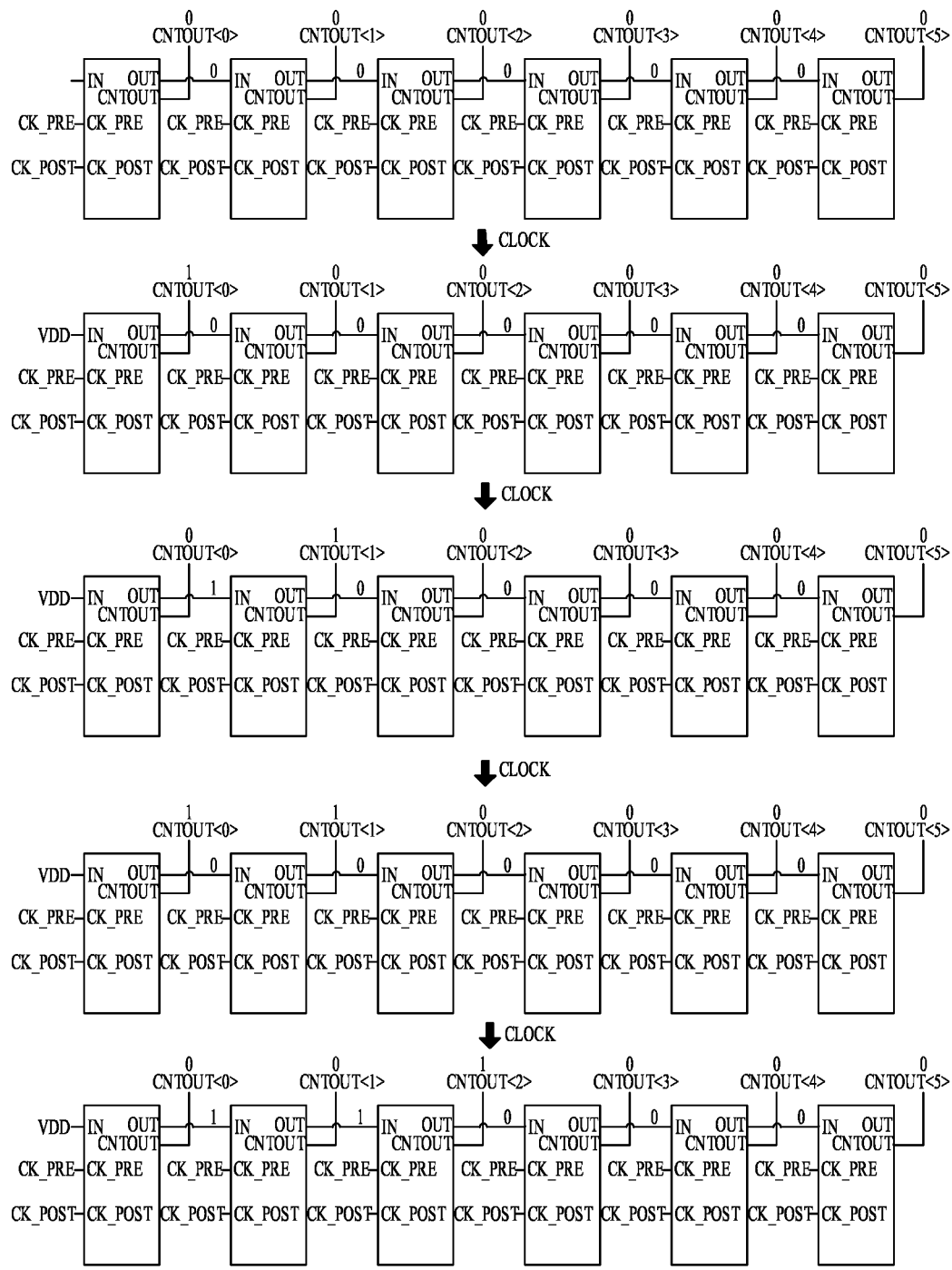
FIG. 5 illustrates a schematic diagram of port states of a counter circuit during addition counting.

In conjunction with the process of addition counting as an example, FIG. 5 illustrates a schematic diagram of port states of a counter circuit during addition counting. FIG. 5 only illustrates each stage of counting circuit in the addition circuit, and other circuits can refer to the structures shown in other drawings. Combined with FIG. 4 and FIG. 5, for example, it is assumed that in an initial state, the bit value currently output by the each stage of counting circuit is set to be 0. When counting is needed, the addend signal is input into the start-stage counting circuit of the counter circuit, and the start-stage counting circuit obtains the this-time bit value of 1 and the carry signal of 0 by calculation according to the bit value, i.e., 0, currently output by the present stage of counting circuit and the addend signal of 1. The carry signal is input into the IN port of the second-stage counting circuit through a carry output terminal OUT of the start-stage counting circuit. During the process, the start-stage counting circuit latches the this-time bit value of 1 in response to the first clock CK PRE. That is, when the first clock arrives (combined with the example in FIG. 4, i.e., when a first rising edge of CK PRE arrives), the start-stage counting circuit latches the this-time bit value of 1, but does not output the this-time bit value to the second-stage counting circuit until the end of the first clock CK_PRE. When the second clock CK POST arrives, the this-time bit value of 1 is output to the output terminal CNTOUT<0> of the start-stage counting circuit, that is, the CNTOUT<0> of the counting result of this time is 1.

For the second-stage counting circuit, the bit value currently output by the second-stage counting circuit has not been updated by the counting, and is thus still the initial value of 0, and the carry signal received from the immediately previous stage of counting circuit (i.e., the start-stage counting circuit) is 0. The second-stage counting circuit can obtain the carry signal of the present stage of 0, and the this-time bit value of 0 as well by calculation. Similarly, the carry signal of the second-stage counting circuit is input into the IN terminal of the third-stage counting circuit through a carry output terminal OUT of the second-stage counting circuit. During the same process, the second-stage counting circuit latches the this-time bit value of 0 in response to the first clock CK_PRE, but does not output the this-time bit value to the third-stage counting circuit until the end of the first clock CK_PRE. When the second clock CK_POST arrives, the this-time bit value of 0 is output to the output terminal CNTOUT<1> of the second-stage counting circuit; that is, the CNTOUT<1> of the counting result of this time is 0.

For each of the remaining stages of counting circuits after the second-stage counting circuit, the working principle is similar to that of the second-stage counting circuit, and the CNTOUT<2:5> output by each of the remaining stages of counting circuits is 0. It can be seen that, after a system clock (CLOCK), the binary representation of the counting result CNTOUT<5:0> is 000001; that is, the decimal representation of the counting result is 1.

After that, the counter circuit continues to work. Examples are as follows: after one time of counting, for the start-stage counting circuit, the currently latched bit value is 1 and the carry signal is 0. For each of the remaining stages of counting circuits, the currently latched bit value is 0 and the carry signal is 0. Therefore, based on the currently latched bit value of 1 and the addend signal of 1, the start-stage counting circuit calculates the calculation result to be 10. That is, the this-time bit value of the start-stage counting circuit is 0 and the carry signal is 1. The start-stage counting circuit inputs the carry signal of 1 into the IN terminal of the second-stage counting circuit through the carry output terminal OUT. In response to the first clock CK_PRE, the this-time bit value of 0 is latched until the end of the first clock CK_PRE. When the second clock CK_POST arrives, the this-time bit value of 0 is output to the output terminal CNTOUT<0> of the start-stage counting circuit.

Based on the carry signal of 1 received at this time and the currently latched bit value of 0, the second-stage counting circuit obtains a calculation result of 01 at this time. That is, the this-time bit value of the second-stage counting circuit is 1 and the carry signal is 0. The second-stage counting circuit inputs the carry signal of 0 into the third-stage counting circuit. In response to the first clock CK_PRE, the this-time bit value of 1 is latched until the end of the first clock CK_PRE. When the second clock CK_POST arrives, the this-time bit value of 1 is output to the output terminal CNTOUT<1> of the second-stage counting circuit. Correspondingly, based on the carry signal of 0 received at this time and the currently latched bit value of 0, the third-stage counting circuit obtains a calculation result of 00 at this time. In such a way, after a second system clock, the CNTOUT<2:5> output by each of the remaining stages of counting circuits is 0. That is, the counting result CNTOUT<5:0> of the counter circuit at this time is 000010, and the decimal representation is 2.

Similarly, the counter circuit continues to work: based on the currently latched bit value of 0 and the addend signal of 1, the start-stage counting circuit calculates the this-time bit value of the start-stage counting circuit to be 1 and the carry signal to be 0. The start-stage counting circuit transmits the carry signal of 0 to the second-stage counting circuit. In response to the first clock CK_PRE, the this-time bit value of 1 is latched until the second clock CK_POST arrives so that CNTOUT<0> outputs the this-time bit value of 1. Based on the carry signal of 0 received at this time and the currently latched bit value of 1, the second-stage counting circuit obtains the this-time bit value of the second-stage counting circuit to be 1 and the carry signal to be 0. When the second clock CK_POST arrives, the CNTOUT<1> of the second-stage counting circuit outputs the this-time bit value 1. In such a way, after a third system clock, the CNTOUT<2:5> output by each of the remaining stages of counting circuits is 0. That is, the counting result CNTOUT<5:0> of the counter circuit at this time is 000011, and the decimal representation is 3.

Subsequently, based on the currently latched bit value of 1 and the addend signal of 1, the start-stage counting circuit calculates the this-time bit value of the start-stage counting circuit to be 0 and the carry signal to be 1. The start-stage counting circuit transmits the carry signal of 1 to the second-stage counting circuit. In response to the first clock CK_PRE, the this-time bit value of 0 is latched until the second clock CK_POST arrives so that CNTOUT<0> outputs the this-time bit value of 0. Based on the carry signal 1 received at this time and the currently latched bit value of 1, the second-stage counting circuit obtains the this-time bit value of the second-stage counting circuit to be 0 and the carry signal to be 1. When the second clock CK_POST arrives, the CNTOUT<1> of the second-stage counting circuit outputs the this-time bit value of 0. Based on the carry signal of 1 received at this time and the currently latched bit value of 0, the third-stage counting circuit obtains the this-time bit value of the third-stage counting circuit to be 1 and the carry signal to be 0. When the second clock CK_POST arrives, CNTOUT<2> outputs the this-time bit value of 1. In such a way, after a fourth system clock, the CNTOUT<3:5> output by each of the remaining stages of counting circuits is 0. That is, the counting result CNTOUT<5:0> of the counter circuit at this time is 000100, and the decimal representation is 4. Subsequently, by implementing the similar principle, the counting results are accumulatively incremented by 1 with each arrival of the system clock.

Figure 6:
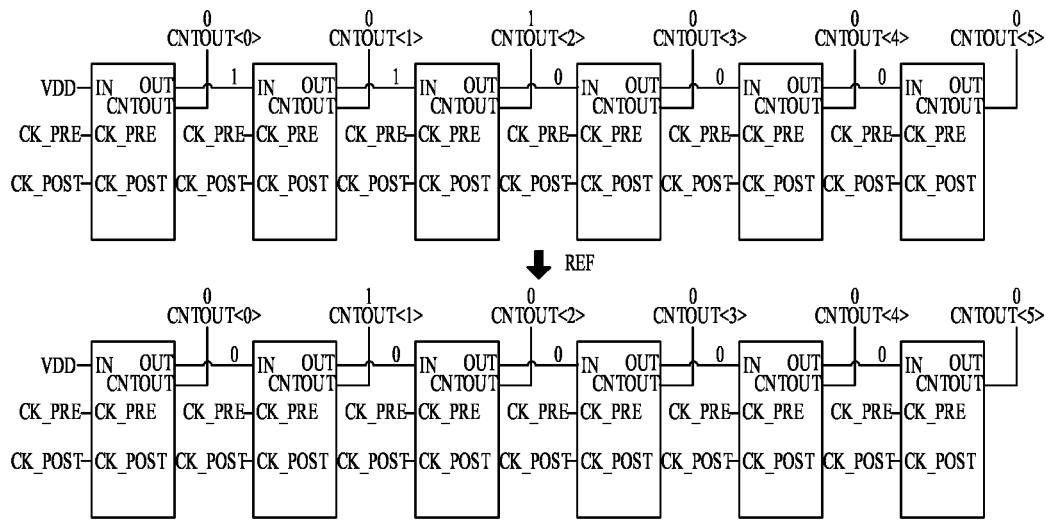
FIG. 6 illustrates a schematic diagram of port states of a counter circuit during subtraction counting.

The above is the example of the process combined with the addition counting processing, and the following is an example based on the process of subtraction counting processing. For example, in conjunction with FIGS. 4 and 6, FIG. 6 illustrates a schematic diagram of port states of a counter circuit during a subtraction counting process. Specifically, the present addition counting result is composed of the bit values output by the multiple stages of counting circuits. In a case that the REF instruction is not activated, the counting result of the counter circuit is the addition counting result composed of the this-time bit values output by the multiple stages of counting circuits. In this example, it is assumed that the current counting result of 000100 is taken as the initial state of the example in FIG. 5; thereafter, if the refresh instruction REF is received, then according to the present addition counting result 000100 and a subtrahend signal which is assumed to be 2 of which the binary representation is 000010, the subtraction circuit calculates the subtraction counting result by subtracting the subtrahend signal from the present addition counting result, i.e., 000010 is subtracted from 000100 to be equal as 000010. The subtraction circuit outputs the subtraction counting result of 000010 in response to the first refresh instruction REF_REF. Since the system clock for the counter circuit is usually paused when the refresh instruction arrives, the counting circuits in the addition circuit, though still calculating, do not output the new addition counting result, but output the currently-latched addition counting result that is obtained at the last time before the arrival of the refresh instruction. Under such cooperation, the control circuit corresponding to each bit of the subtraction counting result output by the subtraction circuit outputs the bit to the output terminal of the corresponding counting circuit as the bit value currently output by the counting circuit, in response to the second refresh instruction REF_POST. Based on this, after the second refresh instruction REF_POST, the counting result CNTOUT<5:0> of the counter circuit is the subtraction counting result of 000010 output by the subtraction circuit, thereby realizing the subtraction counting function of the counter circuit. It should be noted that the output subtraction counting result is equivalent to a currently updated output of the multiple stages of counting circuits. Thus, each stage of counting circuit subsequently calculates the addition counting result of the stage of counting circuit based on the currently updated output, and latches or outputs the addition counting result under the control of the first clock, the second clock, the first refresh instruction and the second refresh instruction.

According to the counter circuit in the embodiment, effective and reliable addition counting and subtraction counting can be achieved. Compared with the counting realized by the use of flip-flops in related art, the counter circuit provided by the embodiment does not need to rely on the multi-stage flip-flop structures, the structures can be simplified, and the counter circuit with more abundant functions can be realized.

Figure 7:
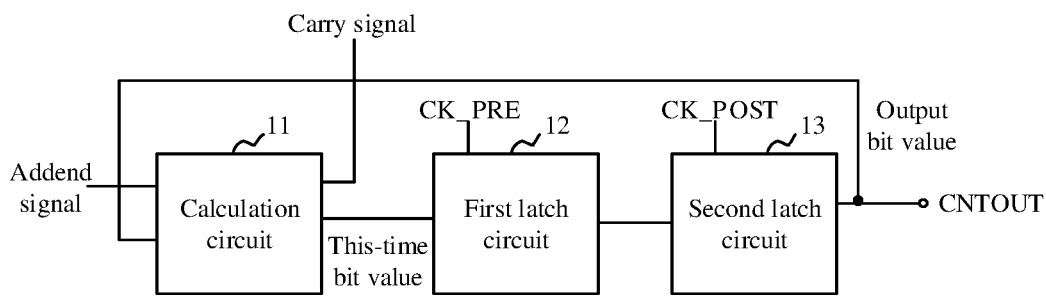
FIGS. 7 to 15 illustrate schematic structural diagrams of a counting circuit according to an embodiment of the present disclosure.

In order to implement the aforementioned counting circuit, in some embodiments, as shown in FIG. 7, FIG. 7 illustrates a schematic structural diagram of a counting circuit according to an embodiment of the present disclosure. Each stage of counting circuit 10 includes a calculation circuit 11, a first latch circuit 12 and a second latch circuit 13.

The calculation circuit 11 is connected to the second latch circuit 13 and a calculation circuit of the next-stage counting circuit, and is configured to: obtain the carry signal and the this-time bit value according to the addend signal and the bit value that is currently output by the second latch circuit 13, and output the carry signal to the calculation circuit of the next-stage counting circuit.

The first latch circuit 12 is connected to the calculation circuit 11 and the second latch circuit 13, and is configured to transmit the this-time bit value to the second latch circuit 13 in response to arrival of the first clock CK_PRE, and latch the this-time bit value in response to end of the first clock CK_PRE.

The second latch circuit 13 is configured to output the this-time bit value to an output terminal CNTOUT of the stage of counting circuit 10 in response to arrival of the second clock CK_POST, and latch the this-time bit value in response to end of the second clock CK_POST.

It should be noted that an example of the structure of only a single counting circuit is shown in FIG. 6, and the structures of other counting circuits may be the same as or similar to that of the counting circuit in this example. The difference is that the addend signal connected to the IN port of the start-stage counting circuit is a high-level signal, such as VDD signal; and the addend signal connected to the IN port of each of the remaining stages of counting circuits is the carry signal output by the carry output terminal OUT of the immediately previous stage of counting circuit.

Specifically, for each stage of counting circuit 10, the calculation circuit 11 obtains the this-time bit value and the carry signal of the present stage of counting circuit 10, by calculation according to the bit value currently latched by the second latch circuit 13 of the present stage of counting circuit 10 and the signal currently received by IN port (for instance, the VDD signal or the carry signal output by the immediately previous stage of counting circuit, which depends on the stage number of the counting circuit). The process can be executed directly after the last accumulative counting without waiting for the first clock CK_PRE or the second clock CK_POSTT. Similarly, the calculation circuit 11 directly transmits the carry signal obtained by this calculation to the calculation circuit of the next-stage counting circuit, and transmits the this-time bit value obtained by this calculation to the first latch circuit 12. The first latch circuit 12 transmits the this-time bit value to the second latch circuit 13 in response to the first clock CK_PRE. When the first clock CK_PRE ends and the second clock CK_POST arrives, the first latch circuit 12 latches the this-time bit value, and the second latch circuit 13 transmits the this-time bit value to the output terminal CNTOUT of the present stage of counting circuit 10. When the second clock CK_POST ends, the second latch circuit 13 latches the this-time bit value, directly takes the bit value as the bit value currently output by the present stage of counting circuit 10, and transmits the bit value to the calculation circuit 11. Thus, according to the bit value currently output by the counting circuit 10 and the signal currently received by the IN port after the present time of counting, the calculation circuit 11 makes calculation again to obtain the this-time bit value and the carry signal of next time of counting. Briefly, after each time of counting, the state of the next counting is prepared, so that the result can be directly latched and output when the next system clock arrives, thereby improving the timeliness and efficiency of counting.

Figure 8:
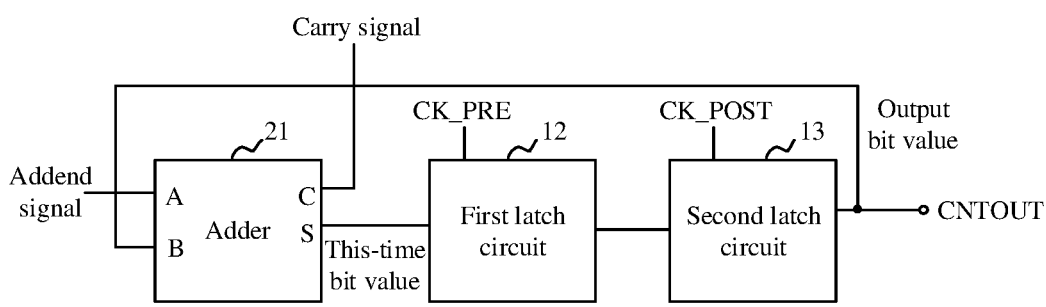

The calculation circuit 11 is configured to perform an addition calculation of the this-time bit value and the carry signal. In some embodiments, as illustrated in FIG. 8, FIG. 8 illustrates a schematic structural diagram of a counting circuit according to an embodiment of the present disclosure. On the basis of the foregoing, the calculation circuit 11 includes an adder 21.

A first input terminal A of the adder 21 is connected to the addend signal, and a second input terminal B of the adder 21 is connected to an output terminal of the second latch circuit 13.

A carry terminal C of the adder 21 is connected to the next-stage counting circuit, and a sum terminal S of the adder 21 is connected to the first latch circuit 12 and is configured to output the this-time bit value.

Specifically, the carry terminal of the adder is the carry output terminal of the counting circuit. In practical applications, the carry terminal of the adder can be connected to the carry output terminal OUT of the counting circuit to output the carry signal through the carry output terminal OUT.

In the embodiment, the calculation circuit includes an adder to implement accurate and effective counting. In this example, the circuit structure is realized by using conventional components, so that the cost can be saved and the circuit structure can be simplified.

Figure 9:
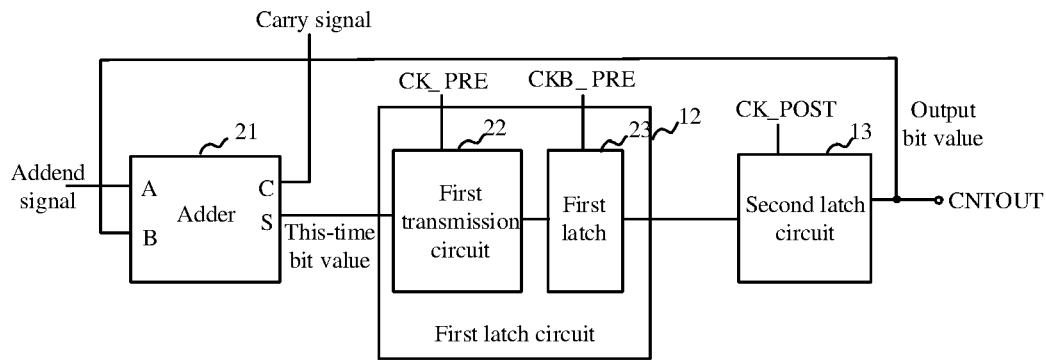

In some embodiments, as illustrated in FIG. 9, FIG. 9 illustrates a schematic structural diagram of a counting circuit according to an embodiment of the present disclosure. On the basis of the foregoing, the first latch circuit 12 includes a first transmission circuit 22 and a first latch 23.

The first transmission circuit 22 is connected to the calculation circuit 11 and the first latch 23, and a control terminal of the first transmission circuit 22 is connected to the first clock CK_PRE so as to conduct transmission in response to the arrival of the first clock CK_PRE and to disconnect the transmission in response to the end of the first clock CK_PRE.

The first latch 23 is connected to the second latch circuit 13, and a control terminal of the first latch 23 is connected to an inverted signal CKB_PRE of the first clock CK_PRE so as to output the this-time bit value to the second latch circuit 13 in response to the arrival of the first clock CK_PRE, and to latch the this-time bit value in response to the end of the first clock CK_PRE.

Specifically, the first latch circuit 12 transmits the this-time bit value to the second latch circuit 13 in response to the arrival of the first clock, and latches the this-time bit value at the end of the first clock. Combined with FIGS. 9 and 4, when the first clock CK_PRE arrives (i.e., when the first clock CK_PRE is flipped to a high level), the first transmission circuit 22 conducts the transmission so that the first transmission circuit 22 transmits the received this-time bit value to the first latch 23. At this time, the inverted signal CKB_PRE of the first clock CK_PRE received by the control terminal of the first latch 23 is at a low level, so the first latch 23 does not switch to the latch function, but plays the function of transmission, that is, transmits the this-time bit value received from the first transmission circuit 22 to the second latch circuit 13. Until the end of the first clock CK_PRE (i.e. when the first clock CK_PRE is flipped to a low level), the first transmission circuit 22 disconnects the transmission to prevent the prepared state of the next time of counting obtained by the calculation circuit from affecting the accuracy of the this-time bit value. At the same time, the inverted signal CKB_PRE of the first clock CK_PRE is flipped to a high level, and the first latch 23 switches from the transmission mode to the latch mode, latches the this-time bit value, and continuously outputs the this-time bit value to the second latch circuit 13; until the first clock arrives again, the first transmission circuit 22 conducts the transmission again to update the latched bit value, to realize the accurate counting. In practical applications, the first transmission circuit and the first latch can be implemented in various manners.

Figure 10:
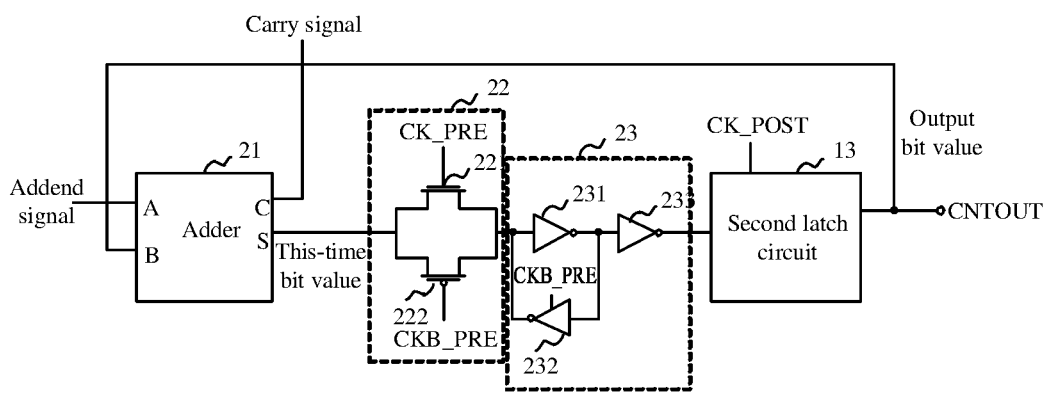

In an example, as illustrated in FIG. 10, FIG. 10 illustrates a schematic structural diagram of a counting circuit according to an embodiment of the present disclosure. The first transmission circuit includes a first transistor 221 and a second transistor 222.

A first terminal of the first transistor 221 is connected to a first terminal of the second transistor 222, and a second terminal of the first transistor 221 is connected to a second terminal of the second transistor 222.

A control terminal of the first transistor 221 is connected to the first clock CK_PRE, and a control terminal of the second transistor 222 is connected to the inverted signal CKB_PRE of the first clock CK_PRE.

The types of the first transistor and the second transistor are not limited. As an example, the first transistor 221 includes a first positive-channel metal oxide semiconductor (PMOS) transistor, and the second transistor 222 includes a first negative-channel metal oxide semiconductor (NMOS) transistor. The first terminal of the first transistor 221 is a source of the first PMOS transistor, the second terminal of the first transistor 221 is a drain of the first PMOS transistor, and the control terminal of the first transistor 221 is a gate of the first PMOS transistor. The first terminal of the second transistor 222 is a drain of the first NMOS transistor, the second terminal of the second transistor 222 is a source of the first NMOS transistor, and the control terminal of the second transistor 222 is a gate of the first NMOS transistor.

In the example, the first transmission circuit is composed of the first transistor and the second transistor, so as to implement accurate and effective counting. In the example, the circuit structure is realized by using conventional components, so that the cost can be saved and the circuit structure can be simplified.

In an example, the first latch includes a first inverter 231, a first tri-state NOT gate 232, and a second inverter 233.

An input terminal of the first inverter 231 is connected to an output terminal of the first transmission circuit 22 and an output terminal of the first tri-state NOT gate 232, and an output terminal of the first inverter 231 is connected to an input terminal of the first tri-state NOT gate 232 and an input terminal of the second inverter 233. A control terminal of the first tri-state NOT gate 232 is connected to the inverted signal CKB_PRE of the first clock CK_PRE.

An output terminal of the second inverter 233 is connected to the second latch circuit 13.

The types and specific structures of the first inverter, the first tri-state NOT gate and the second inverter are not limited. Specifically, when the first clock CK_PRE arrives (i.e., when the first clock CK_PRE is flipped to a high level), the first transmission circuit 22 transmits the received this-time bit value to the first latch 23. At this time, in the first latch 23, the inverted signal CKB_PRE of the first clock CK_PRE received by the control terminal of the first tri-state NOT gate 232 is at a low level, so the first tri-state NOT gate 232 does not operate. At this time, the first latch 23 is equivalent to a serially connected structure composed of the first inverter 231 and the second inverter 233. Through the serially connected structure, the this-time bit value is transmitted to the second latch circuit 13.

When the first clock CK_PRE ends and is flipped to a low level, the first transmission circuit 22 disconnects the transmission. At the same time, the inverted signal CKB_PRE of the first clock CK_PRE is flipped to a high level, the CKB_PRE clock received by the control terminal of the first tri-state NOT gate 232 is flipped to a high level, and the first tri-state NOT gate 232 starts to operate. At this time, the first inverter 231 and the first tri-state NOT gate 232 constitute a latch structure, so the first latch 23 latches the this-time bit value based on the latch structure.

In the example, the first latch is composed of the first inverter, the first tri-state NOT gate and the second inverter, so as to implement accurate and effective counting. In this example, the circuit structure is realized by using conventional components, so that the cost can be saved and the circuit structure can be simplified.

In the embodiment, the first latch circuit includes the first transmission circuit and the first latch, so as to transmit the this-time bit value to the second latch circuit in response to the arrival of the first clock, and to latch the this-time bit value at the end of the first clock, thereby realizing the accurate and effective counting.

Figure 11:
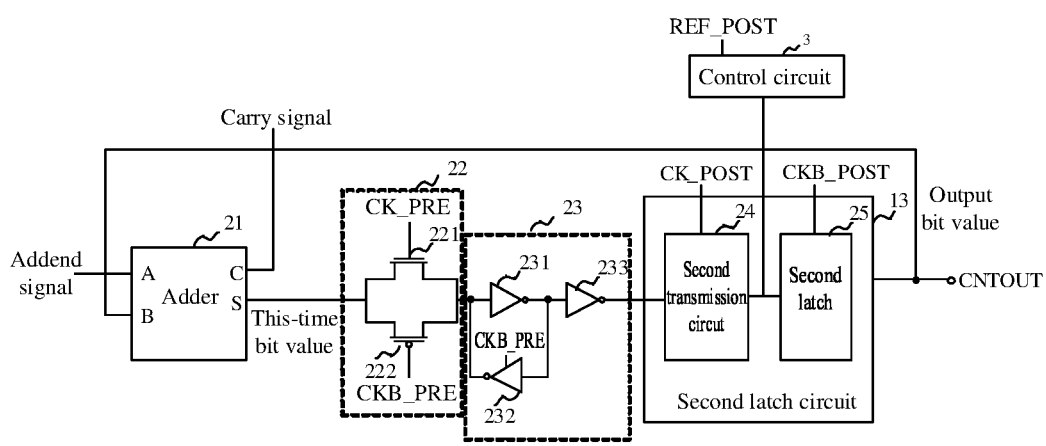

In some embodiments, as illustrated in FIG. 11, FIG. 11 illustrates a schematic structural diagram of a counting circuit according to an embodiment of the present disclosure. On the basis of the foregoing, the second latch circuit 13 includes a second transmission circuit 24 and a second latch 25.

The second transmission circuit 24 is connected to the first latch circuit and the second latch 25, and a control terminal of the second transmission circuit 24 is connected to the second clock CK_POST so as to conduct transmission in response to the arrival of the second clock CK_POST, and to disconnect the transmission in response to the end of the second clock CK_POST.

An input terminal of the second latch 25 is connected to the second transmission circuit 24 and a corresponding control circuit 3. An output terminal of the second latch 25 is connected to the calculation circuit 11. A control terminal of the second latch 25 is connected to the corresponding control circuit 3. The second latch 25 is configured to: when the second refresh instruction REF_POST is not activated, output, to the output terminal of the stage of counting circuit 10 in response to the arrival of the second clock CK_POST, the this-time bit value transmitted by the second transmission circuit 24, and latch the this-time bit value in response to the end of the second clock CK_POST; and when the second refresh instruction REF_POST is activated, output, to the output terminal of the counting circuit 10 as the this-time bit value of the stage of counting circuit 10, a corresponding bit of the subtraction counting result provided by the corresponding control circuit 3, and latch the this-time bit value in response to an end of the second refresh instruction REF_POST.

Specifically, in a case that the second refresh instruction is not activated, the second latch circuit outputs the this-time bit value to the output terminal of the counting circuit in response to the arrival of the second clock, and latches the this-time bit value in response to the end of the second clock. In conjunction with FIGS. 11 and 4, in a case that the second refresh instruction is not activated, when the second clock CK_POST arrives, i.e., when the second clock CK_POST is flipped to a high level, the second transmission circuit 24 conducts the transmission so that the second transmission circuit 24 transmits the received this-time bit value to the second latch 25. At this time, the inverted signal CKB_POST of the second clock CK_POST is at a low level. Based on the CK_POST of the low level and the second refresh instruction REF_POST that is not activated, the control circuit 3 controls the second latch 25 to not switch to the latch function, but to play the function of transmission, that is to transmit the this-time bit value, received from the second transmission circuit 24, to the output terminal CNTOUT of the counting circuit so as to output the this-time bit value. Until the end of the second clock CK_POST, i.e. when the second clock CK_POST is flipped to a low level, the second transmission circuit 24 disconnects the transmission. At the same time, the inverted signal CKB_POST of the second clock CK_POST is flipped to a high level. Based on the CK_POST of the high level and the second refresh instruction REF_POST that is not activated, the control circuit 3 controls the second latch 25 to switch from the transmission mode to the latch mode so as to latch the this-time bit value and continuously output the this-time bit value to the output terminal CNTOUT. Until the first clock arrives again. Each circuit executes operations similar to the foregoing to realize the accumulative update of the counting, thus realizing the accurate counting.

In a case that the second refresh instruction REF_POST is activated, the second clock CK_POST is at a low level, and the second transmission circuit 24 disconnects the transmission. At the same time, the inverted signal CKB_POST of the second clock CK_POST is flipped to a high level. Based on the CKB_POST of the high level and the second refresh instruction REF_POST that is activated, the control circuit 3 controls the second latch 25 to operate in the transmission mode. The difference is that, at this time, what is transmitted to output terminal of the counting circuit is the corresponding bit of the subtraction counting result obtained by the control circuit 3 from the subtraction circuit 2. After that, when the second refresh instruction REF_POST ends, the second clock CK_POST is still at the low level, the second transmission circuit 24 disconnects the transmission, and the inverted signal CKB_POST is still at the high level. Based on the CKB_POST of the high level and the second refresh instruction REF_POST that is not activated, the control circuit 3 controls the second latch 25 to switch to the latch mode so as to latch and output the present subtraction counting result. In practical applications, the second transmission circuit and the second latch can be implemented in various manners.

Figure 12:
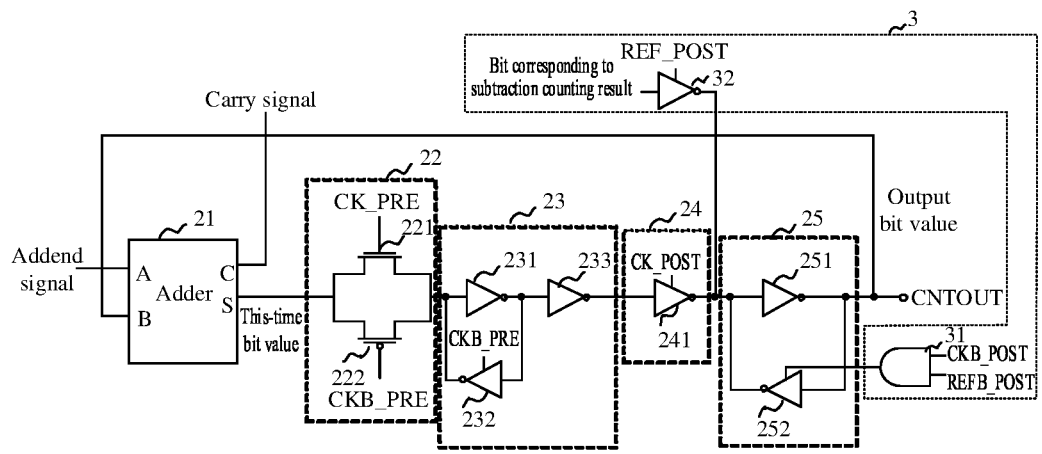

In an example, as illustrated in FIG. 12, FIG. 12 illustrates a schematic structural diagram of a counting circuit according to an embodiment of the present disclosure. As illustrated in FIG. 12, the second transmission circuit 24 includes a second tri-state NOT gate 241.

An input terminal of the second tri-state NOT gate 241 is connected to the first latch circuit, an output terminal of the second tri-state NOT gate 241 is connected to the second latch 25, and a control terminal of the second tri-state NOT gate 241 is connected to the second clock CK_POST.

The type and specific structure of the second tri-state NOT gate are not limited. In the example, the second transmission circuit is composed of the second tri-state NOT gate, so as to implement accurate and effective counting. In this example, the circuit structure is realized by using conventional components, so that the cost can be saved and the circuit structure can be simplified.

In an example, the second latch 25 includes a third inverter 251 and a third tri-state NOT gate 252.

An input terminal of the third inverter 251 is connected to an output terminal of the second transmission circuit 24, an output terminal of the corresponding control circuit 3 and an output terminal of the third tri-state NOT gate 252, and an output terminal of the third inverter 251 is connected to an input terminal of the third tri-state NOT gate 252 and the output terminal CNTOUT of the stage of counting circuit.

A control terminal of the third tri-state NOT gate 252 serves as the control terminal of the second latch 25, and is connected to the corresponding control circuit 3.

The types and specific structures of the third inverter and the third tri-state NOT gate are not limited. Specifically, in a case that the second refresh instruction REF_POST is not activated, when the second clock CK_POST arrives, i.e., when the second clock CK_POST is flipped to a high level, the second transmission circuit 24 transmits the received this-time bit value to the second latch 25. At this time, in the second latch 25, the control circuit 3 controls the third tri-state NOT gate 252 to not operate. In this case, the second latch 25 is equivalent to a series structure composed of the third inverter 251 and the second inverter 233. Through the series structure, the this-time bit value of the present addition counting result is transmitted to the output terminal of the counting circuit.

When the second clock CK_POST ends, the second clock CK_POST is flipped to a low level, and the second transmission circuit 24 disconnects the transmission. At the same time, the inverted signal CKB_POST of the second clock CK_POST is flipped to a high level, and the control circuit 3 controls the third tri-state NOT gate 252 to start to operate. In this case, the third inverter 251 and the third tri-state NOT gate 252 constitute a latch structure, so that the second latch 25 latches the this-time bit value of the addition counting result based on the latch structure.

In a case that the second refresh instruction REF_POST is activated, the second clock CK_POST is at a low level, and the inverted signal CKB_POST is at a high level. The second transmission circuit 24 disconnects the transmission, and the this-time bit value of the present addition counting result is not transmitted to the second latch 25. At this time, in the second latch 25, the control circuit 3 controls the third tri-state NOT gate 252 to not operate. In this case, the second latch 25 is equivalent to a series structure composed of the third inverter 251 and the second inverter 233. Through the series structure, the second latch 25 transmits, to the output terminal of the counting circuit, the corresponding bit of the subtraction counting result provided by the control circuit 3.

When the second refresh instruction REF_POST ends, the second clock CK_POST is still at a low level. The second transmission circuit 24 still disconnects the transmission, and the inverted signal CKB_POST is still at a high level. The control circuit 3 controls the third tri-state NOT gate 252 to start to operate. In this case, the third inverter 251 and the third tri-state NOT gate 252 constitute a latch structure, so the second latch 25 latches, based on the latch structure, the corresponding bit of the present subtraction counting result that is currently output.

In the example, the second latch is composed of the third inverter and the third tri-state NOT gate, so as to implement accurate and effective counting. In this example, the circuit structure is realized by using conventional components, so that the cost can be saved and the circuit structure can be simplified.

Based on the above, the aforementioned control circuit can be implemented through possible implementations. As an example, the control circuit is implemented by a circuit structure. In an embodiment, as illustrated in FIG. 12, the corresponding control circuit 3 includes an AND gate 31 and a fourth tri-state NOT gate 32.

A first input terminal of the AND gate 31 is connected to an inverted signal of the second clock CK_POST. A second input terminal of the AND gate 31 is connected to an inverted signal of the second refresh instruction REF_POST. An output terminal of the AND gate 31 is connected to the control terminal of the second latch 25.

An input terminal of the fourth tri-state NOT gate 32 is connected to the corresponding bit of the subtraction counting result. An output terminal of the fourth tri-state NOT gate 32 is connected to the input terminal of the second latch 25. A control terminal of the fourth tri-state NOT gate 32 is connected to the second refresh instruction REF_POST.

The types and specific structures of the AND gate and the fourth tri-state NOT gate are not limited. Specifically, in a case that the second refresh instruction REF_POST is not activated, the control terminal of the fourth tri-state NOT gate 32 is at a low level, thus, the fourth tri-state NOT gate 32 is disconnected. At this time, the control circuit 3 does not output the subtraction counting result, to avoid affecting the normal transmission of the addition counting result to the output terminal of the counting circuit. When the second clock CK_POST arrives, the second clock CK_POST is flipped to a high level and the CKB_POST is flipped to a low level. The first input terminal of the AND gate receives the CKB_POST of the low level. The second input terminal of the AND gate receives of the inverted signal REFB_POST of the second refresh instruction REF_POST, and the REFB_POST is at a high level at the time. A low level is output after AND logic processing, and accordingly, the second latch 25 operates in the transmission mode. Taking FIG. 11 as an example, the AND gate 31 outputs a low level, and the third tri-state NOT gate 252 in the second latch 25 is disconnected, thus, the second latch 25 is equivalent to a series structure composed of the third inverter 251 and the second inverter 233 to perform the transmission function. When the second clock CK_POST ends, the CKB_POST is flipped to a high level, and both the first input terminal and the second input terminal of the AND gate receive a high level, so the AND gate outputs a high level; and accordingly, the third tri-state NOT gate 252 starts to operate. In this case, the third inverter 251 and the third tri-state NOT gate 252 constitute a latch structure, so the second latch 25 performs the latch processing.

In a case that the second refresh instruction REF_POST is activated, REF_POST is at a high level, the inverted signal REFB_POST is at a low level, the second clock CK_POST is at a low level, the inverted signal CKB_POST is at a high level, and the this-time bit value of the addition counting result is transmitted to the second latch 25. Since the REF_POST is at a high level, the fourth tri-state NOT gate 32 is conducted and transmits, to the second latch 25, the corresponding bit of the subtraction counting result output by the subtraction circuit. At this time, the first input terminal of the AND gate is at the high level, and the second input terminal of the AND gate is at the low level, thus, the AND gate outputs the low level. Similarly, the third tri-state NOT gate 252 in the second latch 25 does not operate, and the second latch 25 transmits the corresponding bit of the subtraction counting result to the output terminal of the counting circuit. When the second refresh instruction REF_POST ends, the inverted signal CKB_POST is still at a high level, and the inverted signal REFB_POST is flipped to the high level, thus, the AND gate outputs the high level and the third tri-state NOT gate 252 starts to operate. The third inverter 251 and the third tri-state NOT gate 252 constitute a latch structure, so the second latch 25 latches the corresponding bit of the present subtraction counting result to serve as the this-time bit value output by the counting circuit, which is used for the next time of counting calculation.

In the example, the control circuit includes the AND gate and the fourth tri-state NOT gate, so as to implement an effective control for the second latch, and further to implement an accurate and effective counting by combining the addition circuit and the subtraction circuit. In this example, the circuit structure is realized by using conventional components, so that the cost can be saved and the circuit structure can be simplified.

In the embodiment, the second latch circuit includes the second transmission circuit and the second latch, so as to switch to the transmission mode or the latch mode in response to the state of the second refresh instruction and the second clock, thereby realizing accurate and effective counting.

Figure 13:
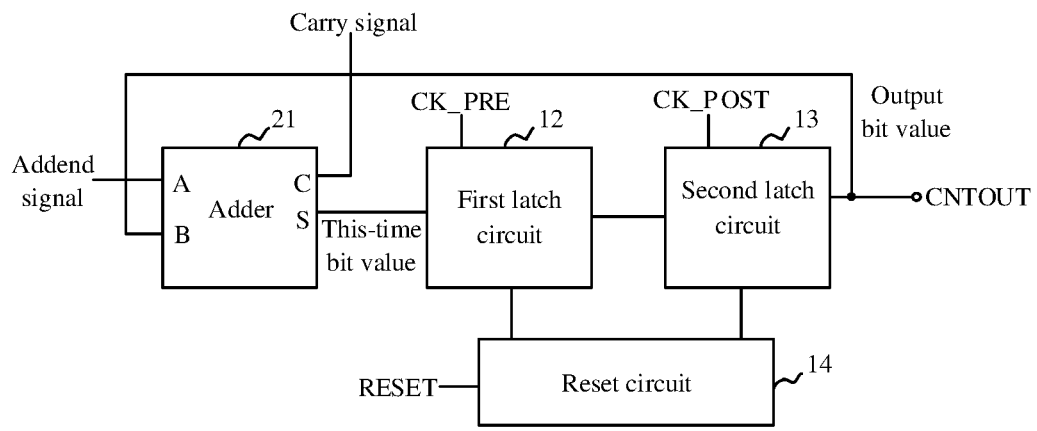

In view of the case that the counting is cleared, a reset function can be set for the counter circuit. In some embodiments, FIG. 13 illustrates a schematic structural diagram of a counting circuit according to an embodiment of the present disclosure. As illustrated in FIG. 13, each stage of counting circuit further includes a first reset circuit 14.

The first reset circuit 14 is connected to the first latch circuit 12 and the second latch circuit 13, and a control terminal of the first reset circuit 14 is connected to a reset signal RESET.

The first reset circuit 14 is configured to reset the first latch circuit 12 and the second latch circuit 13 in response to the reset signal RESET.

Figure 14:
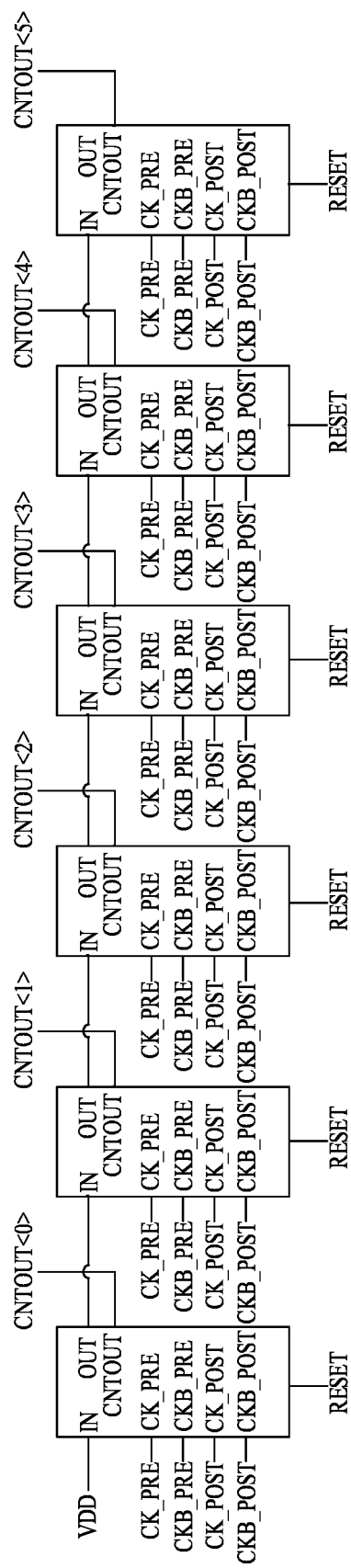

In practical applications, an overall architecture of the counter circuit supporting the reset function is as illustrated in FIG. 14. FIG. 14 illustrates a schematic structural diagram of a counter circuit according to an embodiment of the present disclosure. That is, each counting circuit has a reset port RESET, and these reset ports RESET are connected to the reset signal RESET. In an example, the first reset circuit 14 clears the bit values in the first latch circuit 12 and the second latch circuit 13 in response to the reset signal. Additionally as an example, the counting circuit further includes input ports for the inverted signal of the clock signal, such as, CKB_PRE and CKB_POST ports. In practical applications, the control circuit can also be integrated in the counting circuit; thus in the overall architecture, each technical module may also have input terminals for the refresh instruction and the inverted signal of the refresh instruction, such as, REFB_PRE and REFB_POST terminals. It should be noted that the foregoing examples or embodiments may be implemented alone or in combination, and the drawings merely illustrate situations where some examples or embodiments are implemented in combination, and do not limit other possible implementations.

Figure 15:
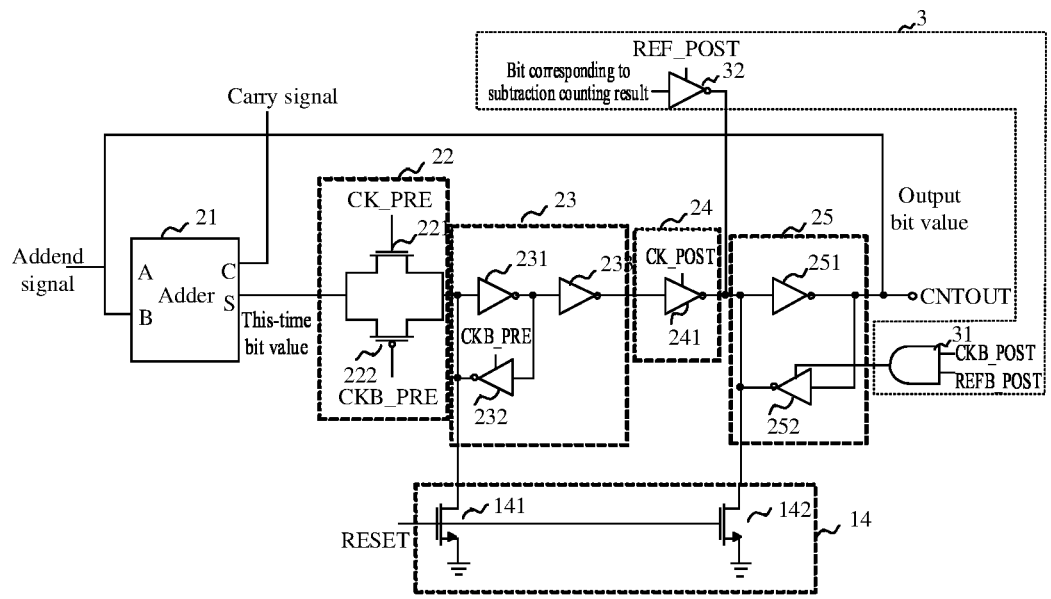

As an example, FIG. 15 illustrates a schematic structural diagram of a counting circuit according to an embodiment of the present disclosure. Based on the foregoing, the first reset circuit 14 includes a first reset switch 141 corresponding to the first latch circuit and a second reset switch 142 corresponding to the second latch circuit.

A first terminal of the first reset switch 141 is connected to the first latch circuit, a second terminal of the first reset switch 141 is grounded, and a control terminal of the first reset switch 141 is connected to the reset signal RESET.

A first terminal of the second reset switch 142 is connected to the second latch circuit, a second terminal of the second reset switch 142 is grounded, and a control terminal of the second reset switch 142 is connected to the reset signal RESET.

The types of the first reset switch and the second reset switch may not be limited. For example, the first reset switch 141 includes a second negative-channel metal oxide semiconductor (NMOS) transistor, and the second reset switch 142 includes a third NMOS transistor.

The first terminal of the first reset switch 141 is a drain of the second NMOS transistor, the second terminal of the first reset switch 141 is a source of the second NMOS transistor, and the control terminal of the first reset switch 141 is a gate of the second NMOS transistor.

The first terminal of the second reset switch 142 is a drain of the third NMOS transistor, the second terminal of the second reset switch 142 is a source of the third NMOS transistor, and the control terminal of the second reset switch 142 is a gate of the third NMOS transistor.

Specifically, when the counter circuit counts normally, the reset signal RESET is in an inactive state. For example, if the reset signal is active at a high level, the reset signal RESET is at a low level at this time. Both the second NMOS transistor and the third NMOS transistor are disconnected, and the first latch circuit 12 and the second latch circuit 13 work normally. When reset is needed, the reset signal RESET is flipped to a high level, correspondingly, the second NMOS transistor and the third NMOS transistor are turned on, and the correspondingly connected nodes in the first latch circuit 12 and the second latch circuit 13 are pulled down to the ground, that is, pulled down to 0. Furthermore, the output of each stage of counting circuit is 0, so that the counting result CNTOUT<5:0> output by the counter circuit is reset to 000000 to realize clearing.

In the embodiment, by providing the first reset circuit, the reset of the counter circuit can be realized, thereby enriching the functions of the counter circuit and further meeting the counting requirements under different situations.

Figure 16:
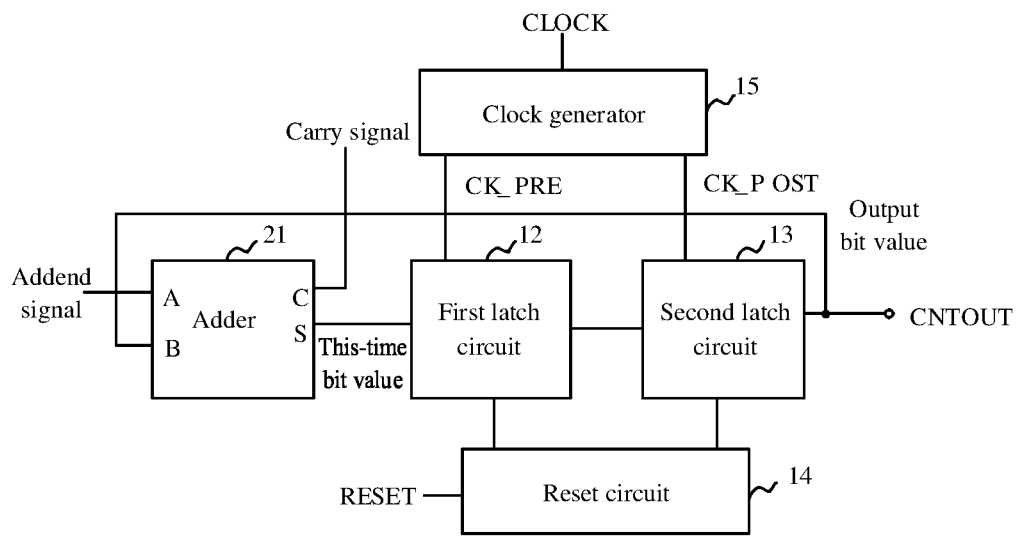
FIG. 16 illustrates a schematic structural diagram of a counter circuit according to an embodiment of the present disclosure.

In addition, in order to provide the first clock and the second clock, an example is shown in FIG. 16. FIG. 16 illustrates a schematic structural diagram of a counter circuit according to an embodiment of the present disclosure (the control circuit and the subtraction circuit are not shown, and can be referred from the foregoing embodiments and figures). On the basis of any of the foregoing examples, the counter circuit further includes a first clock generator 15.

The first clock generator 15 is configured to divide the system clock (CLOCK) to generate the first clock CK_PRE and the second clock CK_POST. A rising edge of the first clock CK_PRE is aligned with a rising edge of the system clock (CLOCK), a falling edge of the first clock CK PRE is aligned with a rising edge of the second clock CK_POST, and a falling edge of the second clock CK_POST is aligned with a falling edge of the system clock (CLOCK).

Specifically, the first clock generator divides the effective level part of the system clock to obtain two clocks, namely, the first clock and the second clock. As an example, reference may be made to the timing diagrams of the system clock, the first clock and the second clock shown in FIG. 4. It should be noted that in practical applications, factors such as transmission delay of signals in the path are considered, and the clock error is considered in "align" here. Therefore, even if there is deviation, it is still within the allowable error range, which is also considered to be aligned.

Figure 17:
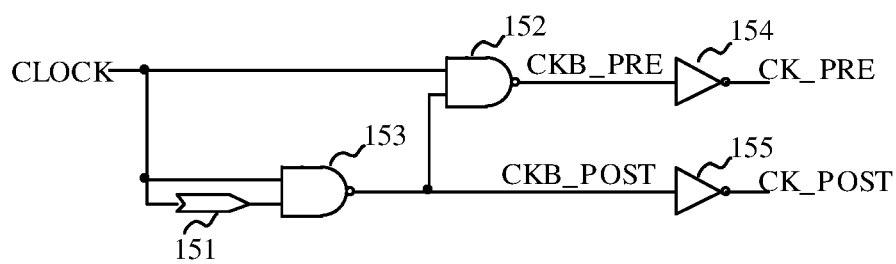
FIG. 17 illustrates a schematic structural diagram of a first clock generator according to an embodiment of the present disclosure.

The specific structure of the clock generator is not limited. In one example, as illustrated in FIG. 17. FIG. 17 illustrates a schematic structural diagram of a first clock generator according to an embodiment of the present disclosure. The first clock generator 15 includes a first delay 151, a first NAND gate 152, a second NAND gate 153, a fourth inverter 154, and a fifth inverter 155.

A first input terminal of the first NAND gate 152 is connected to the system clock (CLOCK), a second input terminal of the first NAND gate 152 is connected to an output terminal of the second NAND gate 153, and an output terminal of the first NAND gate 152 is connected to an input terminal of the fourth inverter 154.

A first input terminal of the second NAND gate 153 is connected to the system clock (CLOCK), a second input terminal of the second NAND gate 153 is connected to an output terminal of the first delay 151, and the output terminal of the second NAND gate 153 is connected to an input terminal of the fifth inverter 155.

An input terminal of the first delay 151 is connected to the system clock (CLOCK). An output terminal of the fourth inverter 154 is configured to output the first clock CK_PRE. An output terminal of the fifth inverter 155 is configured to output the second clock CK_POST.

In this example, the first clock generator is composed of the delay, the first NAND gate, the second NAND gate, the fourth inverter and the fifth inverter, so as to implement the division of the system clock, and to provide the first clock and the second clock to support the accurate and effective counting. In this example, the circuit structure is realized by using conventional components, so that the cost can be saved and the circuit structure can be simplified.

Figure 18:
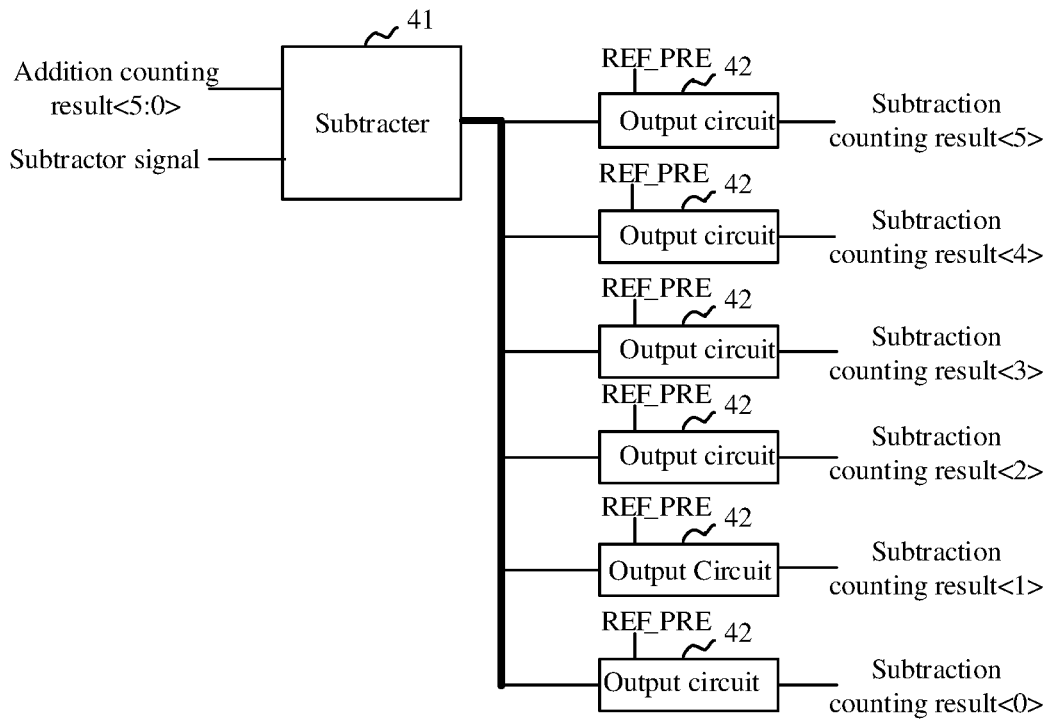
FIGS. 18-22 illustrate a schematic structural diagram of a subtraction circuit according to an embodiment of the present disclosure.

In addition, in order to realize the subtraction counting function, a subtraction circuit is further provided in the embodiment, and the implementation of the subtraction circuit is not limited as well. As an example FIG. 18 illustrates a schematic structural diagram of a subtraction circuit according to an embodiment of the present disclosure. As illustrated in FIG. 18, the subtraction circuit includes a subtractor 41 and a plurality of output circuits 42 corresponding to the binary bits respectively, and a number of the plurality of output circuits is the same as a number of bits of the subtraction counting result.

A first input terminal of the subtractor 41 is connected to the multiple stages of counting circuits, and a second input terminal of the subtractor 41 is connected to the subtrahend signal, so as to obtain the present subtraction counting result by calculating according to the present addition counting result and the subtrahend signal.

Each of the plurality of output circuits 42 is connected to an output terminal of the subtractor 41, and is configured to: output a corresponding bit of the present subtraction counting result in response to an arrival of the first refresh instruction REF PRE, and latch the corresponding bit of the present subtraction counting result in response to an end of the first refresh instruction REF_PRE.

Specifically, the subtractor subtracts the subtrahend signal from the present counting result composed of the bit values currently output by the multiple stages of counting circuits, to obtain the present subtraction counting result and output the present subtraction counting result to the output circuits. Since the subtractor can perform the multi-bit calculation, the number of subtraction circuits can be one in practical applications. There are multiple output circuits each corresponding to a respective bit of the subtraction counting result. For example, in combination with the previous example, when the subtraction counting result contains six bits, six output circuits can be provided. Combined with the examples in the drawings, the subtraction counting result<0> corresponds to the CNTOUT<0> of the counting result, i.e., corresponding to the start-stage counting circuit. By analogy, the subtraction counting result<5> corresponds to the CNTOUT<5> of the counting result, i.e., corresponding to the last-stage counting circuit in the aforementioned drawings. When the first refresh instruction REF PRE arrives, the output circuit transmits, to the control circuit 3, the subtraction counting result output by the subtractor; and when the first refresh instruction REF PRE ends, the output circuit latches the present subtraction counting result.

Figure 19:
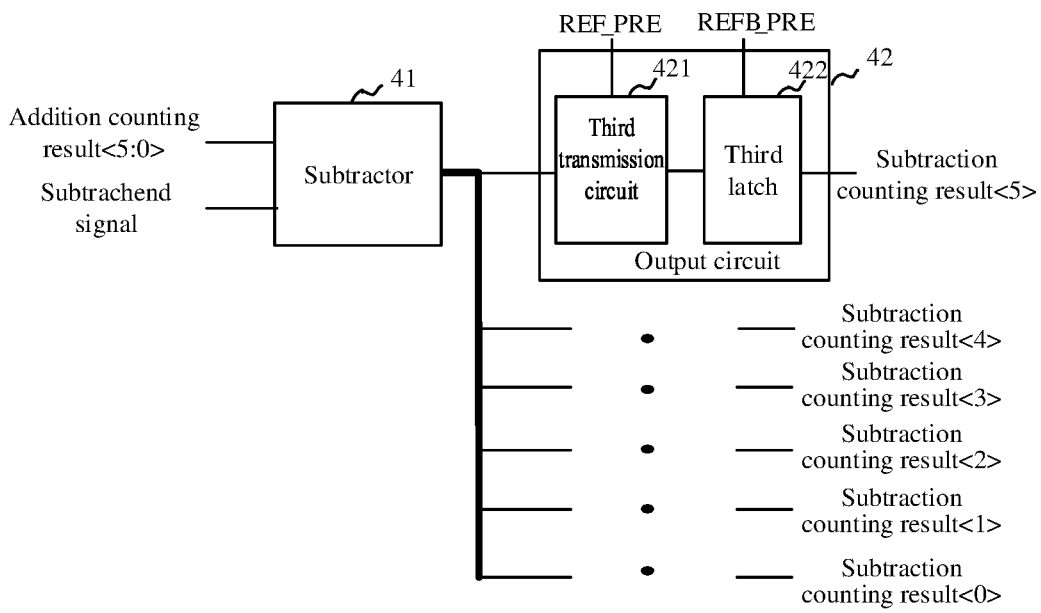

There are various implementations for the output circuits. As an example, FIG. 19 illustrates a schematic structural diagram of a subtraction circuit according to an embodiment of the present disclosure. As illustrated in FIG. 19, each of the plurality of output circuits 42 includes a third transmission circuit 421 and a third latch 422.

The third transmission circuit 421 is connected to the output terminal of the subtractor 41 and the third latch 422, and a control terminal of the third transmission circuit 421 is connected to the first refresh instruction REF_PRE, so as to conduct transmission in response to the arrival of the first refresh instruction REF_PRE, and disconnect the transmission in response to the end of the first refresh instruction REF_PRE.

A control terminal of the third latch 422 is connected to an inverted signal REFB_PRE of the first refresh instruction REF_PRE, and is configured to: output a corresponding bit of the present subtraction counting result in response to the arrival of the first refresh instruction REF PRE, and latch the corresponding bit of the present subtraction counting result in response to the end of the first refresh instruction REF_PRE.

FIG. 19 only illustrates the structure of one output circuit as an example. The structures of the other output circuits may be similar to the structure shown in this example. Specifically, the output circuit transmits the subtraction counting result to the control circuit in response to the arrival of the first refresh instruction, and latches the subtraction counting result in response to the end of the first refresh instruction. Combined with FIGS. 19 and 4, when the first refresh instruction REF_PRE arrives, i.e., when the first refresh instruction REF_PRE is flipped to a high level, the third transmission circuit 421 conducts the transmission so that the third transmission circuit 421 transmits the received subtraction counting result to the third latch 422. At this time, the inverted signal REFB_PRE of the first refresh instruction REF_PRE received by the control terminal of the third latch 422 is at a low level, so the third latch 422 does not switch to the latch function, but plays the function of transmission to output the subtraction counting result. Until the end of the first refresh instruction REF_PRE, i.e. when the first refresh instruction REF_PRE is flipped to a low level, the third transmission circuit 421 disconnects the transmission to prevent the prepared state of the next time of subtraction counting obtained by the subtraction circuit from affecting the accuracy of the current counting. At the same time, the inverted signal REFB_PRE is flipped to a high level, and the third latch 422 switches from the transmission mode to the latch mode, to latch the present subtraction counting result and continuously output the present subtraction counting result to the control circuit until the first refresh instruction arrives again. Thus, the subtraction counting result can be output accurately. In practical applications, the third transmission circuit and the third latch can be implemented in various manners.

Figure 20:
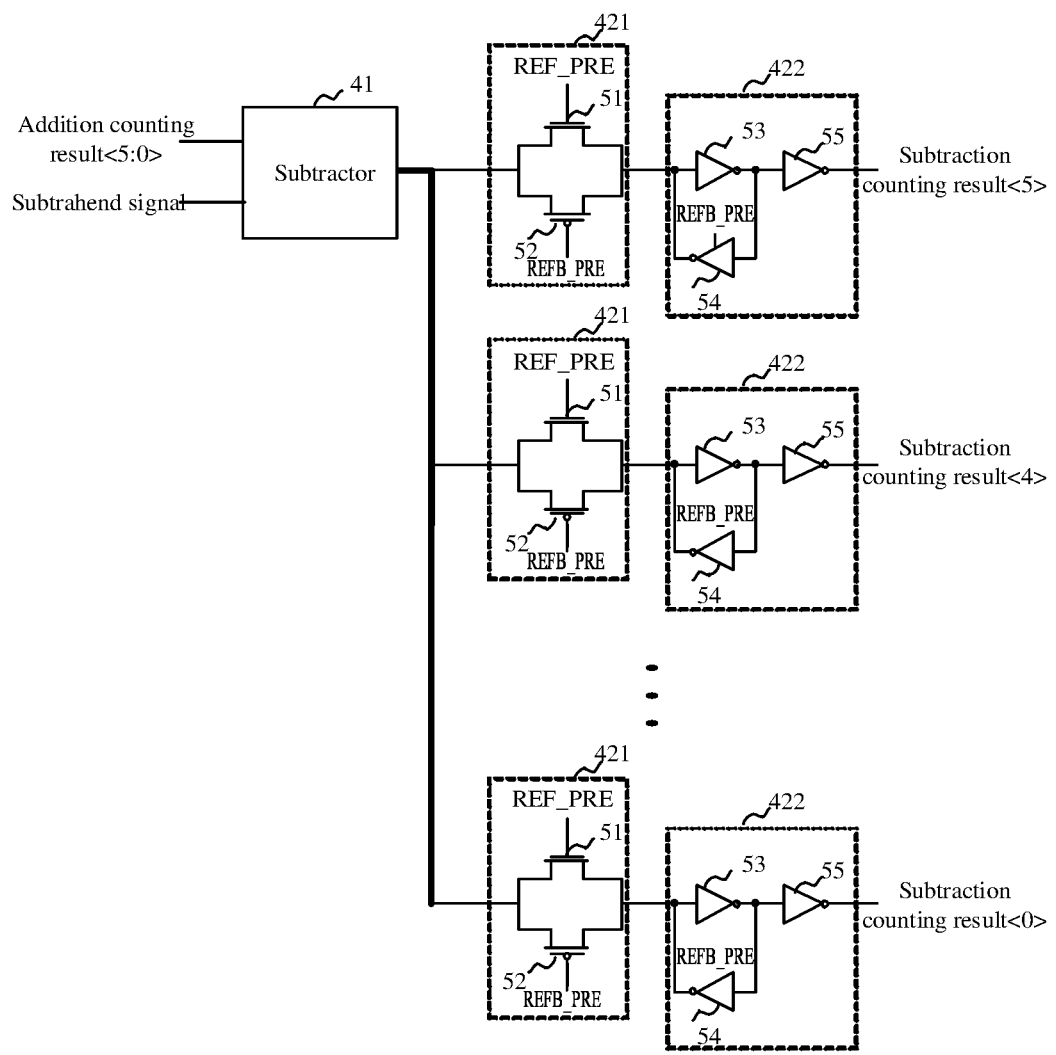

In an example, as illustrated in FIG. 20, FIG. 20 illustrates a schematic structural diagram of a subtraction circuit according to an embodiment of the present disclosure. The third transmission circuit 421 includes a third transistor 51 and a fourth transistor 52.

A first terminal of the third transistor 51 is connected to a first terminal of the fourth transistor 52, and a second terminal of the third transistor 51 is connected to a second terminal of the fourth transistor 52.

A control terminal of the third transistor 51 is connected to the first refresh instruction REF_PRE, and a control terminal of the fourth transistor 52 is connected to the inverted signal REFB_PRE of the first refresh instruction REF_PRE.

The types of the third transistor and the fourth transistor are not limited. As an example, the third transistor 51 includes a second PMOS transistor and the fourth transistor 52 includes a fourth NMOS transistor. A first terminal of the third transistor 51 is a source of the second PMOS transistor, a second terminal of the third transistor 51 is a drain of the second PMOS transistor, and a control terminal of the third transistor 51 is a gate of the second PMOS transistor. A first terminal of the fourth transistor 52 is a drain of the fourth NMOS transistor, a second terminal of the fourth transistor 52 is a source of the fourth NMOS transistor, and a control terminal of the fourth transistor 52 is a gate of the fourth NMOS transistor.

In the example, the third transmission circuit is composed of the third transistor and the fourth transistor, so as to implement an accurate and effective counting. In the example, the circuit structure is realized by using conventional components, so that the cost can be saved and the circuit structure can be simplified.

In an example, the third latch 422 includes a sixth inverter 53, a fifth tri-state NOT gate 54, and a seventh inverter 55.

An input terminal of the sixth inverter 53 is connected to an output terminal of the third transmission circuit 421 and an output terminal of the fifth tri-state NOT gate 54. An output terminal of the sixth inverter 53 is connected to an input terminal of the fifth tri-state NOT gate 54 and an input terminal of the seventh inverter 55. A control terminal of the fifth tri-state NOT gate 54 is connected to the inverted signal REFB_PRE of the first refresh instruction REF_PRE.

An output terminal of the seventh inverter 55 is connected to the corresponding control circuit.

The types and specific structures of the sixth inverter, the fifth tri-state NOT gate, and the seventh inverter are not limited. Specifically, when the first refresh instruction REF_PRE arrives, i.e., when the first refresh instruction REF_PRE is flipped to a high level, the third transmission circuit 421 transmits the received this-time bit value to the third latch 422. At this time, in the third latch 422, the inverted signal REFB_PRE of the first refresh instruction REF_PRE received by the control terminal of the fifth tri-state NOT gate 54 is at a low level, so the fifth tri-state NOT gate 54 does not operate. In this case, the third latch 422 is equivalent to a series structure composed of the sixth inverter 53 and the seventh inverter 55. Through the series structure, the corresponding bit of the subtraction counting result is output to the corresponding control circuit.

When the first refresh instruction REF_PRE ends, the first refresh instruction REF_PRE is flipped to a low level, and the third transmission circuit 421 disconnects the transmission. At the same time, the inverted signal REFB_PRE of the first refresh instruction REF_PRE is flipped to a high level, the REFB_PRE clock received by the control terminal of the fifth tri-state NOT gate 54 is flipped to a high level, and the fifth tri-state NOT gate 54 starts to operate. At this time, the sixth inverter 53 and the fifth tri-state NOT gate 54 constitute a latch structure, so the third latch 422 latches the corresponding bit of the subtraction counting result based on the latch structure.

In the example, the third latch is composed of the sixth inverter, the fifth tri-state NOT gate and the seventh inverter, so as to implement an accurate and effective counting. In this example, the circuit structure is realized by using conventional components, so that the cost can be saved and the circuit structure can be simplified.

Figure 21:
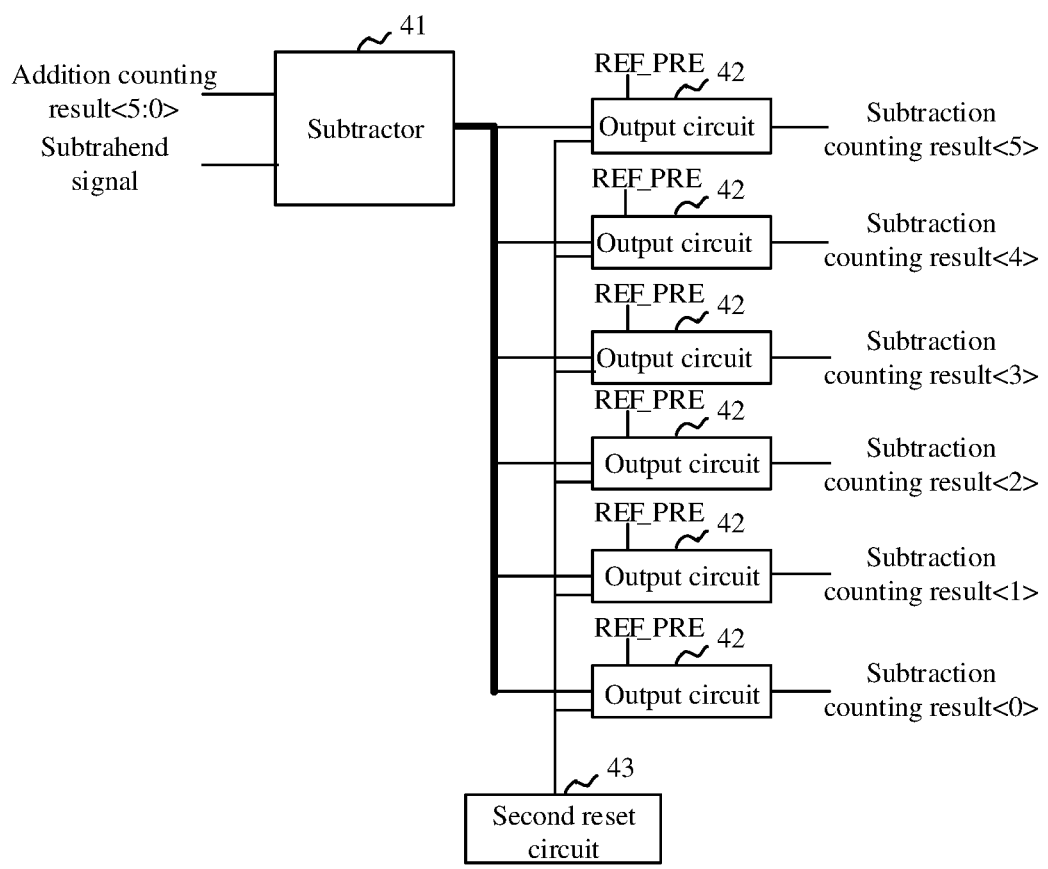

Further considering the reset function of the subtraction circuit, in some embodiments, FIG. 21 illustrates a schematic structural diagram of a subtraction circuit according to an embodiment of the present disclosure. As illustrated in FIG. 21, the subtraction circuit further includes a second reset circuit 43.

The second reset circuit 43 is connected to each third latch 422, and a control terminal of the second reset circuit 43 is connected to a reset signal RESET.

The second reset circuit 43 is configured to reset the third latch 422 in response to the reset signal RESET.

Figure 22:
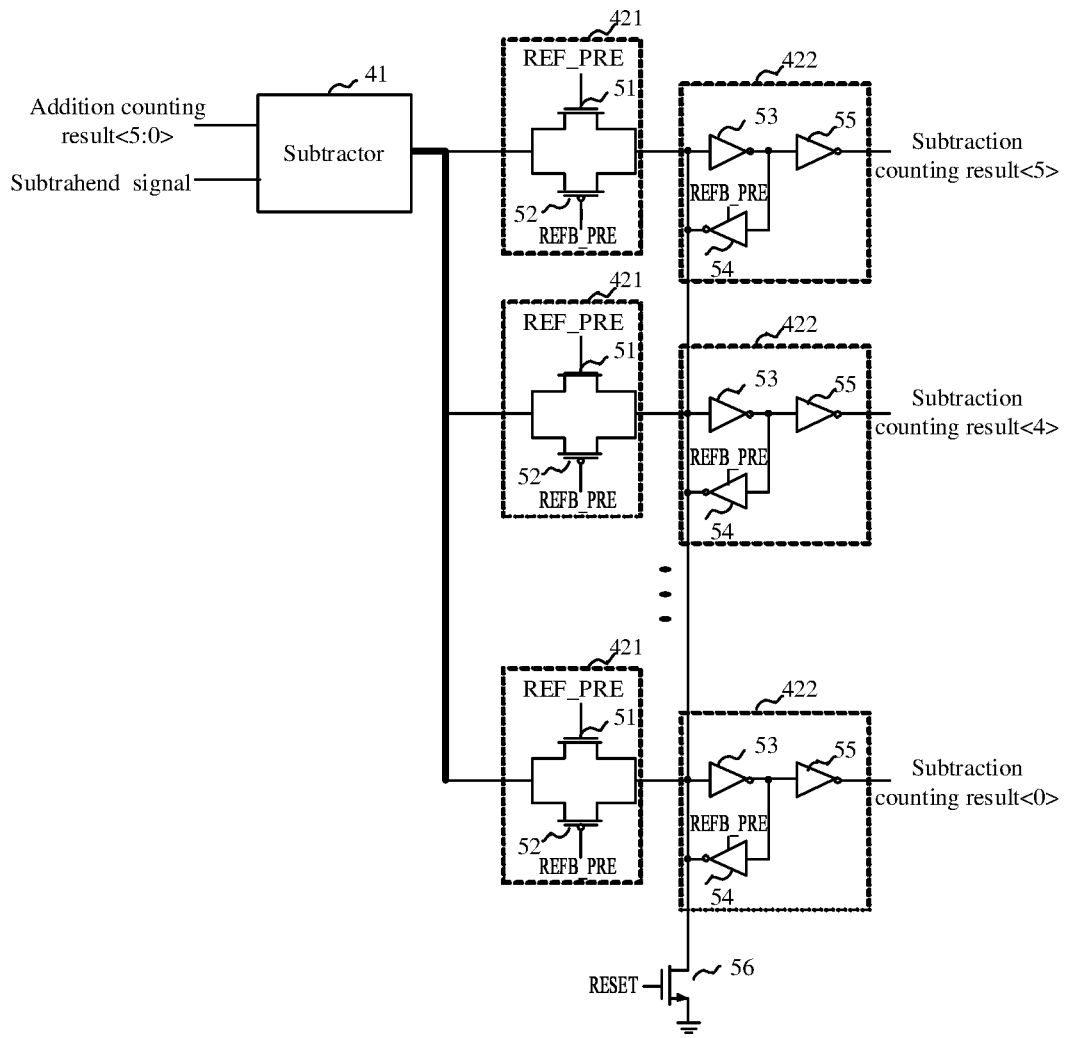

In the embodiment, the subtraction circuit also has a reset port RESET, and the reset port RESET is connected to the reset signal RESET. In an example, the second reset circuit 43 clears the bit values in the third latch 422 in response to the reset signal. As an example, FIG. 22 illustrates a schematic structural diagram of a subtraction circuit according to an embodiment of the present disclosure. Based on the foregoing, the second reset circuit 43 includes a third reset switch 56.

A first terminal of the third reset switch 56 is connected to each third latch 422, a second terminal of the third reset switch 56 is grounded, and a control terminal of the third reset switch 56 is connected to the reset signal RESET.

The type of the third reset switch may not be limited. For example, the third reset switch 56 includes a fifth NMOS transistor. A first terminal of the third reset switch 56 is a drain of the fifth NMOS transistor, a second terminal of the third reset switch 56 is a source of the fifth NMOS transistor, and a control terminal of the third reset switch 56 is a gate of the fifth NMOS transistor.

Specifically, when the subtraction circuit operates normally, the reset signal RESET is in an inactive state. For example, it is assumed that the reset signal is active at a high level, then the reset signal RESET is at a low level at this time. The fifth NMOS transistor is disconnected, and the third latch operates normally. When reset is needed, the reset signal RESET is flipped to a high level; and accordingly, the fifth NMOS transistor is conducted, and the node at the third latch is pulled down to the ground, that is, pulled down to 0. Thus, each of the output circuits outputs 0, so that the subtraction counting result output by the subtraction circuit is reset to 000000, thereby realizing clearing.

In the embodiment, by providing the second reset circuit, the reset of the subtraction circuit can be realized, thereby enriching the functions of the counter circuit and further meeting the counting requirements under different situations.

In addition, in order to provide the first refresh instruction and the second refresh instruction, as an example, on the basis of any of the foregoing examples, the counter circuit further includes a second clock generator.

The second clock generator is configured to divide the refresh instruction REF to generate the first refresh instruction REF_PRE and the second refresh instruction REF_POST. A rising edge of the first refresh instruction REF_PRE is aligned with a rising edge of the refresh instruction REF. A falling edge of the first refresh instruction REF_PRE is aligned with a rising edge of the second refresh instruction REF_POST. A falling edge of the second refresh instruction REF_POST is aligned with a falling edge of the refresh instruction REF.

Specifically, the second clock generator divides the effective level part of the refresh instruction to obtain two clocks, namely, the first refresh instruction and the second refresh instruction. As an example, reference may be made to the timing diagrams of the refresh instruction, the first refresh instruction and the second refresh instruction shown in FIG. 4. It should be noted that in practical applications, factors such as transmission delay of signals in the path are considered, and the clock error is also considered in "aligned" here. Therefore, even if there is deviation, it is still within the allowable error range, which is also considered to be aligned.

Figure 23:
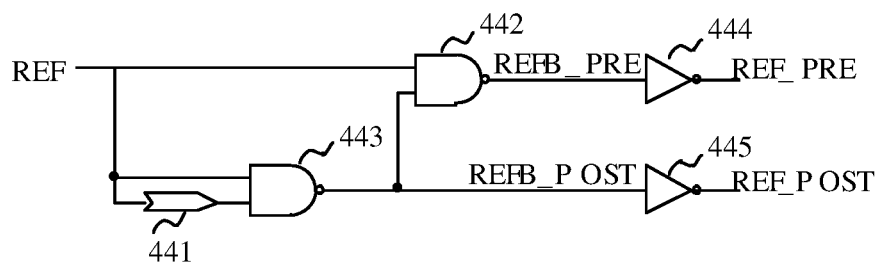
FIG. 23 illustrates a schematic structural diagram of a second clock generator according to an embodiment of the present disclosure.

The specific structure of the second clock generator is not limited. In one example, as illustrated in FIG. 23, FIG. 23 illustrates a schematic structural diagram of a second clock generator according to an embodiment of the present disclosure. The second clock generator includes a second delay 441, a third NAND gate 442, a fourth NAND gate 443, an eighth inverter 444, and a ninth inverter 445.

A first input terminal of the third NAND gate 442 is connected to the refresh instruction REF. A second input terminal of the third NAND gate 442 is connected to an output terminal of the fourth NAND gate 443. An output terminal of the third NAND gate 442 is connected to an input terminal of the eighth inverter 444.

A first input terminal of the fourth NAND gate 443 is connected to the refresh instruction REF. A second input terminal of the fourth NAND gate 443 is connected to an output terminal of the second delay 441. An output terminal of the fourth NAND gate 443 is connected to an input terminal of the ninth inverter 445.

An input terminal of the second delay 441 is connected to the refresh instruction REF. An output terminal of the eighth inverter 444 is configured to output the first refresh instruction REF_PRE. An output terminal of the ninth inverter 445 is configured to output the second refresh instruction REF_POST.

The counter circuit provided by the embodiment includes an addition circuit, a subtraction circuit and control circuits. The addition circuit includes multiple stages of counting circuits corresponding to binary bits. Each stage of counting circuit is configured to: obtain a carry signal and a this-time bit value according to an addend signal and a bit value currently output by the stage of counting circuit, output the carry signal to a next-stage counting circuit, latch the this-time bit value in response to a first clock, and output the this-time bit value to an output terminal of the stage of counting circuit in response to a second clock. An output of the counter circuit is composed of bit values output by the multiple stages of counting circuits, and the output is a binary representation of a counting result. The first clock and the second clock are obtained based on division of a system clock. The subtraction circuit performs subtraction calculation according to bit values currently output by the multiple stages of counting circuits, to cooperate with the control circuits to output a subtraction counting result when subtraction counting processing is needed. In the above scheme, the addition circuit is composed of the multiple stages of counting circuits each of which executes the addition processing of the present stage, and latches the bit value of the previous time of counting in response to the first clock, and the output results of the multiple stages of counting circuits constitute the binary representation of the whole counting result. Thus, the addition counting function can be realized while realizing the subtraction counting function with cooperation of the subtraction circuit and the control circuits. The aforementioned counter circuit can be realized by using an adder and a subtractor without relying on flip-flops to implement counting, thereby realizing more flexible and abundant counting functions.

Other embodiments of the present disclosure will readily occur to those skilled in the art upon consideration of the description and practice of the invention disclosed herein. The present disclosure is intended to cover any variations, uses, or adaptations of the present disclosure that follow the general principles of the present disclosure and include common sense or conventional techniques in the art not disclosed herein. The description and embodiments are to be considered exemplary only and the true scope and spirit of the present disclosure are indicated by the appended claims.

It should be understood that the present disclosure is not limited to the precise structure described above and shown in the drawings, and various modifications and changes may be made without departing from the scope thereof. The scope of the present disclosure is limited only by the appended claims.

The invention claimed is:

1. A counter circuit, comprising: an addition circuit, a subtraction circuit and a plurality of control circuits, wherein:
the addition circuit comprises multiple stages of counting circuits corresponding to binary bits, and each stage of counting circuit is configured to: obtain a carry signal and a this-time bit value according to an addend signal and a bit value that is currently output by the stage of counting circuit, output the carry signal to a next-stage counting circuit, latch the this-time bit value in response to a first clock, and output the this-time bit value to an output terminal of the stage of counting circuit in response to a second clock, wherein an addend signal of a start-stage counting circuit is a high-level signal, and an addend signal of a non-start-stage counting circuit is a carry signal output by an immediately previous stage of counting circuit;
the subtraction circuit is connected to the multiple stages of counting circuits and is configured to: obtain a present subtraction counting result by calculating according to a present addition counting result and a subtrahend signal, and output the present subtraction counting result in response to a first refresh instruction, wherein the present addition counting result is a multi-bit signal composed of this-time bit values output by the multiple stages of counting circuits, and the present subtraction counting result comprises a multi-bit signal; and
each of the plurality of control circuits corresponds to a respective one of the multiple stages of counting circuits, is connected to the respective one of the multiple stages of counting circuits and the subtraction circuit, and is configured to output, in response to a second refresh instruction, a corresponding bit of the present subtraction counting result to the respective one of the multiple stages of counting circuits to serve as the bit value output by the respective one of the multiple stages of counting circuits, wherein an output of the counter circuit is composed by bit values output by the multiple stages of counting circuits, the output is a binary representation of a counting result, the first clock and the second clock are obtained based on division of a system clock, and the first refresh instruction and the second refresh instruction are obtained based on division of a refresh instruction.

2. The counter circuit of claim 1, wherein each stage of counting circuit comprises: a calculation circuit, a first latch circuit and a second latch circuit; and
the calculation circuit is connected to the second latch circuit and a calculation circuit of the next-stage counting circuit, and is configured to: obtain the carry signal and the this-time bit value according to the addend signal and the bit value that is currently output by the second latch circuit, and output the carry signal to the calculation circuit of the next-stage counting circuit;
the first latch circuit is connected to the calculation circuit and the second latch circuit, and is configured to: transmit the this-time bit value to the second latch circuit in response to arrival of the first clock, and latch the this-time bit value in response to end of the first clock; and
the second latch circuit is configured to: output the this-time bit value to the output terminal of the stage of counting circuit in response to arrival of the second clock, and latch the this-time bit value in response to end of the second clock.

3. The counter circuit of claim 2, wherein the calculation circuit comprises an adder; and
a first input terminal of the adder is connected to the addend signal, and a second input terminal of the adder is connected to an output terminal of the second latch circuit; and
a carry terminal of the adder is connected to the next-stage counting circuit, and a sum terminal of the adder is connected to the first latch circuit and is configured to output the this-time bit value.

4. The counter circuit of claim 2, wherein the first latch circuit comprises a first transmission circuit and a first latch;
the first transmission circuit is connected to the calculation circuit and the first latch, and a control terminal of the first transmission circuit is connected to the first clock so as to conduct transmission in response to the arrival of the first clock, and to disconnect the transmission in response to the end of the first clock; and
the first latch is connected to the second latch circuit, and a control terminal of the first latch is connected to an inverted signal of the first clock so as to output the this-time bit value to the second latch circuit in response to the arrival of the first clock, and to latch the this-time bit value in response to the end of the first clock.

5. The counter circuit of claim 4, wherein the first transmission circuit comprises a first transistor and a second transistor;
a first terminal of the first transistor is connected to a first terminal of the second transistor, and a second terminal of the first transistor is connected to a second terminal of the second transistor; and a control terminal of the first transistor is connected to the first clock, and a control terminal of the second transistor is connected to the inverted signal of the first clock.

6. The counter circuit of claim 5, wherein the first transistor comprises a first positive-channel metal oxide semiconductor (PMOS) transistor, and the second transistor comprises a first negative-channel metal oxide semiconductor (NMOS) transistor;

the first terminal of the first transistor is a source of the first PMOS transistor, the second terminal of the first transistor is a drain of the first PMOS transistor, and the control terminal of the first transistor is a gate of the first PMOS transistor; and the first terminal of the second transistor is a drain of the first NMOS transistor, the second terminal of the second transistor is a source of the first NMOS transistor, and the control terminal of the second transistor is a gate of the first NMOS transistor.

7. The counter circuit of claim 4, wherein the first latch comprises a first inverter, a first tri-state NOT gate, and a second inverter;

an input terminal of the first inverter is connected to an output terminal of the first transmission circuit and an output terminal of the first tri-state NOT gate, and an output terminal of the first inverter is connected to an input terminal of the first tri-state NOT gate and an input terminal of the second inverter; and a control terminal of the first tri-state NOT gate is connected to the inverted signal of the first clock; and an output terminal of the second inverter is connected to the second latch circuit.

8. The counter circuit of claim 2, wherein the second latch circuit comprises a second transmission circuit and a second latch;

the second transmission circuit is connected to the first latch circuit and the second latch, and a control terminal of the second transmission circuit is connected to the second clock so as to conduct transmission in response to the arrival of the second clock, and to disconnect the transmission in response to the end of the second clock; and an input terminal of the second latch is connected to the second transmission circuit and a corresponding control circuit, an output terminal of the second latch is connected to the calculation circuit, and a control terminal of the second latch is connected to the corresponding control circuit, wherein the second latch is configured to: when the second refresh instruction is not activated, output the this-time bit value transmitted by the second transmission circuit to the output terminal of the stage of counting circuit in response to the arrival of the second clock, and latch the this-time bit value in response to the end of the second clock; and when the second refresh instruction is activated, output a corresponding bit of the subtraction counting result provided by the corresponding control circuit to the output terminal of the counting circuit as the this-time bit value of the stage of counting circuit, and latch the this-time bit value in response to an end of the second refresh instruction.

9. The counter circuit of claim 8, wherein the second transmission circuit comprises a second tri-state NOT gate; and an input terminal of the second tri-state NOT gate is connected to the first latch circuit, an output terminal of the second tri-state NOT gate is connected to the second latch, and a control terminal of the second tri-state NOT gate is connected to the second clock.

10. The counter circuit of claim 8, wherein the second latch comprises a third inverter and a third tri-state NOT gate;

an input terminal of the third inverter is connected to an output terminal of the second transmission circuit, an output terminal of the corresponding control circuit and an output terminal of the third tri-state NOT gate, and an output terminal of the third inverter is connected to an input terminal of the third tri-state NOT gate and the output terminal of the stage of counting circuit; and a control terminal of the third tri-state NOT gate serves as the control terminal of the second latch and is connected to the corresponding control circuit.

11. The counter circuit of claim 8, wherein the corresponding control circuit comprises an AND gate and a fourth tri-state NOT gate;

a first input terminal of the AND gate is connected to an inverted signal of the second clock, a second input terminal of the AND gate is connected to an inverted signal of the second refresh instruction, and an output terminal of the AND gate is connected to the control terminal of the second latch; and an input terminal of the fourth tri-state NOT gate is connected to the corresponding bit of the subtraction counting result, an output terminal of the fourth tri-state NOT gate is connected to the input terminal of the second latch, and a control terminal of the fourth tri-state NOT gate is connected to the second refresh instruction.

12. The counter circuit of claim 2, wherein each stage of counting circuit further comprises a first reset circuit;

the first reset circuit is connected to the first latch circuit and the second latch circuit, and a control terminal of the first reset circuit is connected to a reset signal; and the first reset circuit is configured to reset the first latch circuit and the second latch circuit in response to the reset signal.

13. The counter circuit of claim 12, wherein the first reset circuit comprises: a first reset switch corresponding to the first latch circuit, and a second reset switch corresponding to the second latch circuit;

a first terminal of the first reset switch is connected to the first latch circuit, a second terminal of the first reset switch is grounded, and a control terminal of the first reset switch is connected to the reset signal; and a first terminal of the second reset switch is connected to the second latch circuit, a second terminal of the second reset switch is grounded, and a control terminal of the second reset switch is connected to the reset signal.

14. The counter circuit of claim 1, wherein the subtraction circuit comprises a subtractor and a plurality of output circuits corresponding to the binary bits respectively, a number of the plurality of output circuits is the same as a number of bits of the subtraction counting result;

a first input terminal of the subtractor is connected to the multiple stages of counting circuits, and a second input terminal of the subtractor is connected to the subtrahend signal, so as to obtain the present subtraction counting result by calculating according to the present addition counting result and the subtrahend signal; and each of the plurality of output circuits is connected to an output terminal of the subtractor, and is configured to output a corresponding bit of the present subtraction counting result in response to an arrival of the first refresh instruction, and latch the corresponding bit of the present subtraction counting result in response to an end of the first refresh instruction.

15. The counter circuit of claim 14, wherein each of the plurality of output circuits comprises a third transmission circuit and a third latch;
the third transmission circuit is connected to the output terminal of the subtractor and the third latch, and a control terminal of the third transmission circuit is connected to the first refresh instruction, so as to conduct transmission in response to the arrival of the first refresh instruction, and disconnect the transmission in response to the end of the first refresh instruction; and
a control terminal of the third latch is connected to an inverted signal of the first refresh instruction, and is configured to: output a corresponding bit of the present subtraction counting result in response to the arrival of the first refresh instruction, and latch the corresponding bit of the present subtraction counting result in response to the end of the first refresh instruction.

16. The counter circuit of claim 15, wherein the third transmission circuit comprises a third transistor and a fourth transistor;
a first terminal of the third transistor is connected to a first terminal of the fourth transistor, and a second terminal of the third transistor is connected to a second terminal of the fourth transistor; and
a control terminal of the third transistor is connected to the first refresh instruction, and a control terminal of the fourth transistor is connected to the inverted signal of the first refresh instruction.

17. The counter circuit of claim 16, wherein the third transistor comprises a second positive-channel metal oxide semiconductor (PMOS) transistor and the fourth transistor comprises a fourth negative-channel metal oxide semiconductor (NMOS) transistor;
a first terminal of the third transistor is a source of the second PMOS transistor, a second terminal of the third transistor is a drain of the second PMOS transistor, and a control terminal of the third transistor is a gate of the second PMOS transistor; and
a first terminal of the fourth transistor is a drain of the fourth NMOS transistor, a second terminal of the fourth transistor is a source of the fourth NMOS transistor, and a control terminal of the fourth transistor is a gate of the fourth NMOS transistor.

18. The counter circuit of claim 15, wherein the third latch comprises a sixth inverter, a fifth tri-state NOT gate, and a seventh inverter;
an input terminal of the sixth inverter is connected to an output terminal of the third transmission circuit and an output terminal of the fifth tri-state NOT gate, an output terminal of the sixth inverter is connected to an input terminal of the fifth tri-state NOT gate and an input terminal of the seventh inverter, and a control terminal of the fifth tri-state NOT gate is connected to the inverted signal of the first refresh instruction; and
an output terminal of the seventh inverter is connected to the corresponding control circuit.

19. The counter circuit of claim 15, wherein the subtraction circuit further comprises a second reset circuit;
the second reset circuit is connected to each third latch, and a control terminal of the second reset circuit is connected to a reset signal; and
the second reset circuit is configured to reset the third latch in response to the reset signal.

20. The counter circuit of claim 19, wherein the second reset circuit comprises a third reset switch;
a first terminal of the third reset switch is connected to each third latch, a second terminal of the third reset switch is grounded, and a control terminal of the third reset switch is connected to the reset signal.

\* \* \* \* \*